(12) United States Patent
Kim et al.

(10) Patent No.: US 10,756,289 B2
(45) Date of Patent: Aug. 25, 2020

(54) LIGHTING APPARATUS USING ORGANIC LIGHT EMITTING DIODE FOR SUPPRESSING DETERIORATION OF LUMINCANCE IN ENTIRE PANEL CAUSED BY SHORT CIRCUIT AND MANUFACTURING METHOD THEREOF

(71) Applicant: LG Display Co., Ltd., Seoul (KR)

(72) Inventors: JongMin Kim, Pyeongtaek-si (KR); TaeJoon Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/032,272

(22) Filed: Jul. 11, 2018

(65) Prior Publication Data

US 2019/0019982 A1 Jan. 17, 2019

(30) Foreign Application Priority Data

Jul. 11, 2017 (KR) .................. 10-2017-0088048

(51) Int. Cl.
*H01L 21/00* (2006.01)
*H01L 51/52* (2006.01)
*H01L 51/56* (2006.01)
*H01L 51/00* (2006.01)

(52) U.S. Cl.
CPC ...... *H01L 51/5212* (2013.01); *H01L 51/0021* (2013.01); *H01L 51/5203* (2013.01); *H01L 51/5253* (2013.01); *H01L 51/56* (2013.01); *H01L 2251/5361* (2013.01); *H01L 2251/5392* (2013.01)

(58) Field of Classification Search
USPC ........................................... 257/40
See application file for complete search history.

(56) References Cited

U.S. PATENT DOCUMENTS

| | | | | |
|---|---|---|---|---|
| 7,435,996 B2* | 10/2008 | Jin | ............ | H01L 33/24 257/88 |
| 8,564,002 B2* | 10/2013 | Kim | ............ | H01L 27/3262 257/98 |
| 8,575,605 B2* | 11/2013 | Heo | ............ | H01L 27/1225 257/40 |
| 10,079,368 B2* | 9/2018 | Lee | ............ | H01L 27/326 |
| 2012/0175617 A1* | 7/2012 | Kim | ............ | H01L 27/3246 257/59 |

(Continued)

FOREIGN PATENT DOCUMENTS

| KR | 2003-0034325 A | 5/2003 |
|---|---|---|
| KR | 2003-0076917 A | 9/2003 |

(Continued)

*Primary Examiner* — Caleb E Henry
(74) *Attorney, Agent, or Firm* — Polsinelli PC

(57) ABSTRACT

According to a lighting apparatus using an organic light emitting diode of the present disclosure and a manufacturing method thereof, a transparent high resistance conductive layer is used for an anode instead of ITO to control the concentrated current due to the short and the anode of the emission area lowers the resistance through the post-treatment to suppress the lowering of luminance. Further, the auxiliary electrode is formed of a transparent nanowire and the first protective layer above the auxiliary electrode is removed to be utilized as an emission area, so that the aperture ratio is drastically improved.

11 Claims, 26 Drawing Sheets

(56) References Cited

U.S. PATENT DOCUMENTS

| | | | | |
|---|---|---|---|---|
| 2012/0211739 A1* | 8/2012 | Koyama | ............... | H01B 1/122 |
| | | | | 257/40 |
| 2014/0361256 A1* | 12/2014 | Kim | ....................... | H01L 51/52 |
| | | | | 257/40 |
| 2015/0214452 A1* | 7/2015 | Lee | .................... | H01L 51/5271 |
| | | | | 257/66 |
| 2015/0340413 A1* | 11/2015 | Lee | .................... | G09G 3/3291 |
| | | | | 257/40 |
| 2016/0155900 A1* | 6/2016 | Bono | ................. | H01L 33/0079 |
| | | | | 438/27 |
| 2016/0211316 A1* | 7/2016 | Oh | ..................... | H01L 27/3279 |
| 2017/0317311 A1* | 11/2017 | Popp | .................... | H01L 51/5212 |
| 2018/0358568 A1* | 12/2018 | Luan | ................... | H01L 51/0023 |

FOREIGN PATENT DOCUMENTS

| | | |
|---|---|---|
| KR | 10-2014-0138614 A | 12/2014 |
| KR | 10-1469413 B1 | 12/2014 |
| KR | 10-1477929 B1 | 12/2014 |
| KR | 10-1477953 B1 | 12/2014 |
| KR | 10-1477955 B1 | 12/2014 |
| KR | 10-1582719 B1 | 1/2016 |

\* cited by examiner

RESISTANCE NOTATION: 10^ (Ω/□)

| TEMPERATURE CONDITION | COATING CONDITION | | THERMAL TREATMENT TIME (min) | | | | | |
|---|---|---|---|---|---|---|---|---|
| | EJECTION AMOUNT (cc) | THICKNESS(um) | 0 | 20 | 40 | 60 | 80 | 100 |
| 150 °C | 100 | 124 | 8.6 | 8 | 7.9 | 7.7 | 7.7 | 7.7 |
| | 200 | 263 | 7.8 | 7.8 | 7.8 | 7.7 | 7.6 | 7.6 |
| | 300 | 396 | 4.6 | 6.6 | 6.5 | 6.5 | 6.4 | 6.3 |
| | 400 | 520 | 7.7 | 6.5 | 6.4 | 6.4 | 6.3 | 6.2 |
| | 500 | 718 | CRACK IS GENERATED | | | | | |
| 250 °C | 100 | 124 | 8.6 | 6.2 | 6.1 | 6.1 | 6.1 | 5.9 |
| | 200 | 263 | 7.8 | 6.2 | 6.2 | 5.9 | 5.8 | 5.8 |
| | 300 | 396 | 7.6 | 5.5 | 5.4 | 5.3 | 5.3 | 5.3 |
| | 400 | 520 | 7.7 | 5.5 | 5.5 | 5.3 | 5.3 | CRACK |
| | 500 | 718 | CRACK IS GENERATED | | | | | |

LIGHTING APPARATUS USING ORGANIC LIGHT EMITTING DIODE FOR SUPPRESSING DETERIORATION OF LUMINCANCE IN ENTIRE PANEL CAUSED BY SHORT CIRCUIT AND MANUFACTURING METHOD THEREOF

CROSS-REFERENCE TO RELATED APPLICATION

This application claims the priority of Korean Patent Application No. 10-2017-0088048 filed on Jul. 11, 2017, in the Korean Intellectual Property Office, the disclosure of which is incorporated herein by reference in its entirety.

BACKGROUND

Field of the Disclosure

The present disclosure relates to a lighting apparatus, and more particularly, to a lighting apparatus using an organic light emitting diode and a manufacturing method thereof.

Description of the Background

Currently, fluorescent lamps or incandescent lamps are mainly used as lighting apparatuses. Among them, the incandescent lamps have a good color rendering index (CRI), but have a very low energy efficiency. Further, the fluorescent lamps have a good efficiency, but have a low color rendering index and contain mercury, which may cause an environmental problem.

The color rendering index is an index representing color reproduction. In other words, the color rendering index represents how much a feeling of a color of an object illuminated by a specific light source is similar to a feeling of a color of the object illuminated by a reference light source. For example, a CRI of sunlight is 100.

In order to solve the problems of the lighting apparatus of the conventional art, recently, a light emitting diode (LED) is suggested as a lighting apparatus. The light emitting diode is formed of an inorganic light emitting material. A luminous efficiency is the highest in the blue wavelength range and the luminous efficiency is lowered toward a red wavelength range and a green wavelength range which has the highest visibility. Therefore, there is a disadvantage in that when a red light emitting diode, a green light emitting diode, and a blue light emitting diode are combined to emit white light, the luminous efficiency can be lowered.

As an alternative, a lighting apparatus using an organic light emitting diode (OLED) has been developed. In a lighting apparatus using a general organic light emitting diode, an anode electrode formed of ITO is formed on a glass substrate. Further, an organic light emitting layer and a cathode electrode are formed and a protective layer and a lamination film are formed thereon to manufacture the lighting apparatus.

However, in the lighting apparatus using an organic light emitting diode, when a short circuit can occur due to foreign materials, not only the luminance of the corresponding pixel in which the short circuit occurs, but also the luminance of the entire panel is deteriorated due to the current drop.

SUMMARY

Accordingly, the present disclosure is to provide a lighting apparatus using an organic light emitting diode and a manufacturing method thereof which may suppress the deterioration of the luminance of the entire panel when the short circuit causes due to foreign materials.

In addition, the present disclosure is to provide a lighting apparatus using an organic light emitting diode and a manufacturing method thereof which may suppress the deterioration of the luminance without reducing an aperture ratio.

Further, the present disclosure is to provide a lighting apparatus and a manufacturing method thereof which drastically improve an aperture ratio by utilizing a non-emission area of the conventional art as an emission area.

The present disclosure is not limited to the above-mentioned objects, and other objects, which are not mentioned above, can be clearly understood by those skilled in the art from the following descriptions.

According to an aspect of the present disclosure, a lighting apparatus using an organic light emitting diode includes: an auxiliary electrode configured of a transparent nanowire on a substrate, a first-first electrode made of a transparent conductive layer and is provided to cover the auxiliary electrode and a second-first electrode which is provided in an emission area divided by the auxiliary electrode, an organic light emitting layer and a second electrode in an illuminating unit of the substrate including the first and second first electrodes, and an encapsulating unit in the illuminating unit of the substrate.

According to another aspect of the present disclosure, a manufacturing method of a lighting apparatus using an organic light emitting diode includes: forming an auxiliary electrode on a substrate using a transparent nanowire, forming a first electrode using a transparent conductive layer having a higher resistance value than ITO, on the substrate on which the auxiliary electrode is formed, lowering the resistance value of the first electrode of an emission area divided by the auxiliary electrode through a thermal treatment, forming an organic light emitting layer and a second electrode in an illuminating unit of the substrate on which the first electrode is formed, and forming an encapsulating unit in the illuminating unit of the substrate.

Other detailed matters of the aspects are included in the detailed description and the drawings.

According to one exemplary aspect of the present disclosure, the lighting apparatus using an organic light emitting diode and a manufacturing method thereof may provide an effect that suppresses a lighting failure which is caused on the entire panel due to the short caused by the foreign materials and ensures a normal luminance by lowering the resistance of the emission area.

Further, according to one exemplary aspect of the present disclosure, the lighting apparatus using an organic light emitting diode and a manufacturing method thereof may provide an effect which increases luminance and lifespan in accordance with improvement of the aperture ratio by improving light interruption due to an auxiliary electrode of the conventional art which is a non-emission area.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
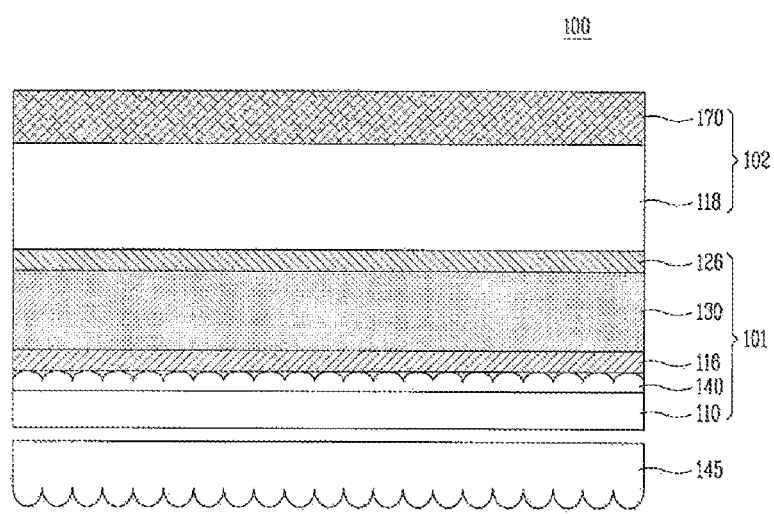
FIG. 1 is a cross-sectional view exemplarily illustrating a lighting apparatus using an organic light emitting diode according to a first exemplary aspect of the present disclosure.

Hereinafter, exemplary aspects of a lighting apparatus using an organic light emitting diode according to the present disclosure and a manufacturing method thereof will be described in detail with reference to the accompanying drawing to be easily carried out by those skilled in the art.

Advantages and characteristics of the present disclosure and a method of achieving the advantages and characteristics will be clear by referring to exemplary aspects described below in detail together with the accompanying drawings. However, the present disclosure is not limited to the following exemplary aspects but may be implemented in various different forms. The exemplary aspects are provided only to complete disclosure of the present disclosure and to fully provide a person having ordinary skill in the art to which the present disclosure pertains with the category of the disclosure, and the present disclosure will be defined by the appended claims. Like reference numerals indicate like elements throughout the specification. Sizes and relative sizes of layers and region in the drawings may be exaggerated for clarity of description.

When an element or layer is disposed "on" another element or layer, another layer or another element may be interposed directly on the other element or therebetween. In contrast, when an element is disposed directly on or above another element, another element or layer is not interposed therebetween.

Spatially relative terms such as "below, beneath", "lower", "above", or "upper" may be used to easily describe the correlation between one element or components and other element or components as illustrated in the drawings. The spatially relative terms should be understood to include different directions of the elements when the elements are used or operated in addition to the direction illustrated in the drawings. For example, when the element illustrated in the drawing is turned over, an element which is disposed below or beneath another element may be disposed above another element. Accordingly, the exemplary term "below" or "beneath" may include both downward and upward directions.

The terms used in the present specification are for explaining the aspects rather than limiting the present disclosure. Unless particularly stated otherwise in the present specification, a singular form also includes a plural form. The meaning of "comprises" and/or "comprising" used in this specification does not exclude the existence or addition of aforementioned constituent elements, steps, operations, and/or device, and one or more other constituent elements, steps, operations, and/or devices.

FIG. 1 is a cross-sectional view exemplarily illustrating a lighting apparatus using an organic light emitting diode according to a first exemplary aspect of the present disclosure.

Figure 2:
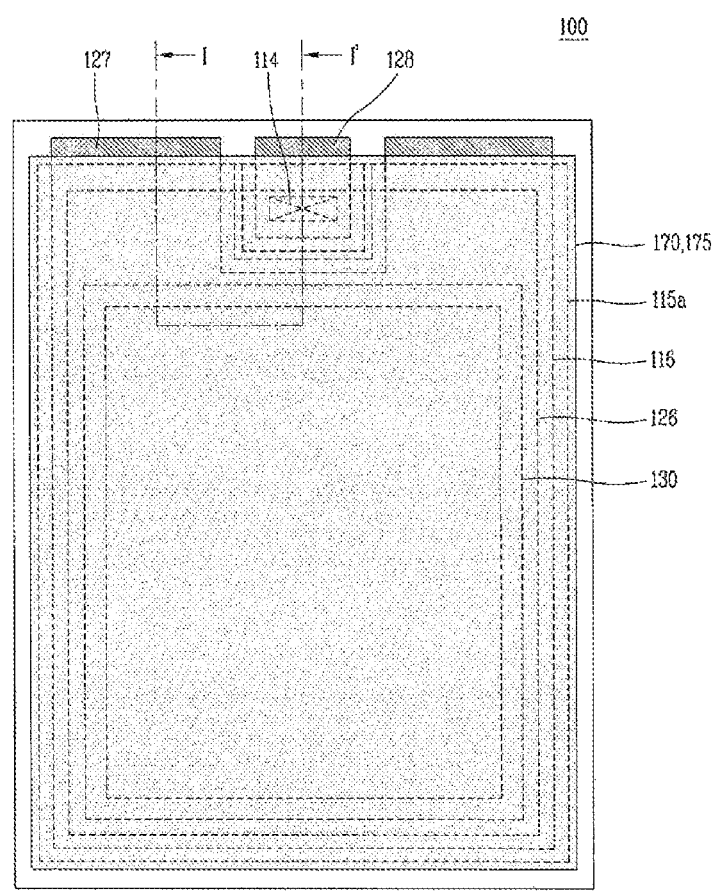
FIG. 2 is a plan view schematically illustrating a lighting apparatus using an organic light emitting diode according to a first exemplary aspect of the present disclosure.

FIG. 2 is a plan view schematically illustrating a lighting apparatus using an organic light emitting diode according to a first exemplary aspect of the present disclosure.

Figure 3:
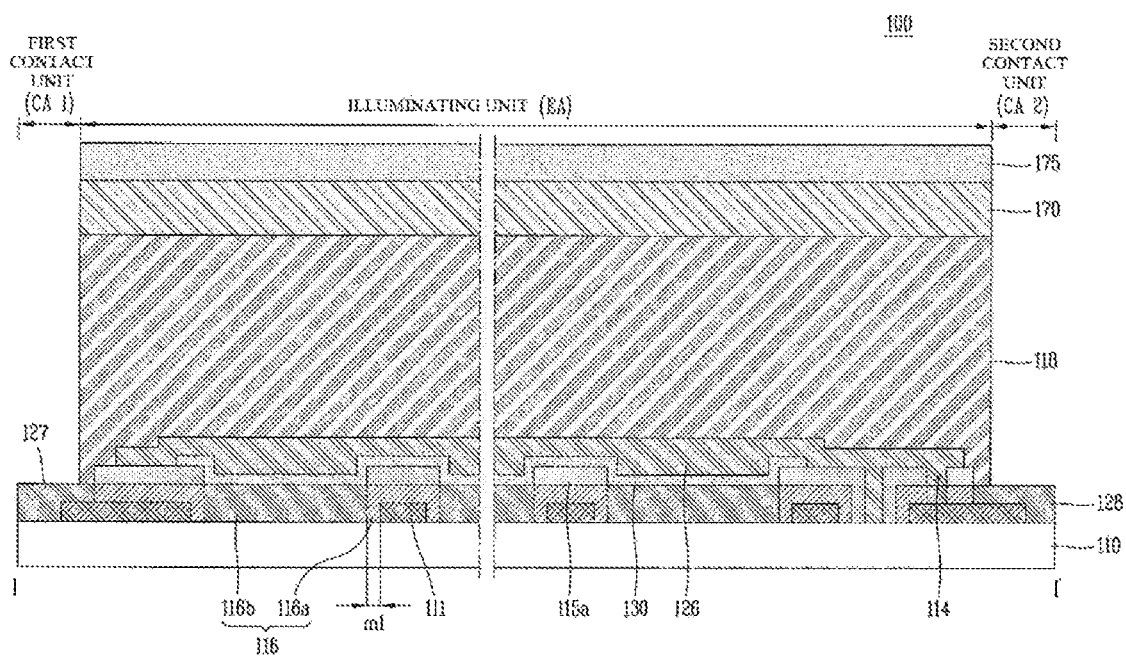
FIG. 3 is a schematic cross-sectional view of a lighting apparatus using an organic light emitting diode according to a first exemplary aspect of the present disclosure taken along line I-I' of FIG. 2.

FIG. 3 is a schematic cross-sectional view of a lighting apparatus using an organic light emitting diode according to a first exemplary aspect of the present disclosure taken along line I-I' of FIG. 2.

Figure 4:
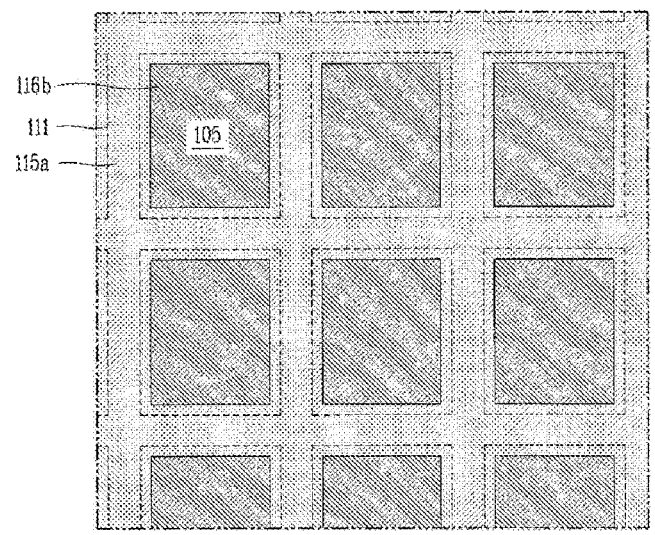
FIG. 4 is an enlarged view illustrating a part of an illuminating unit illustrated in FIG. 2.

FIG. 4 is an enlarged view illustrating a part of an illuminating unit illustrated in FIG. 2.

Figure 5:
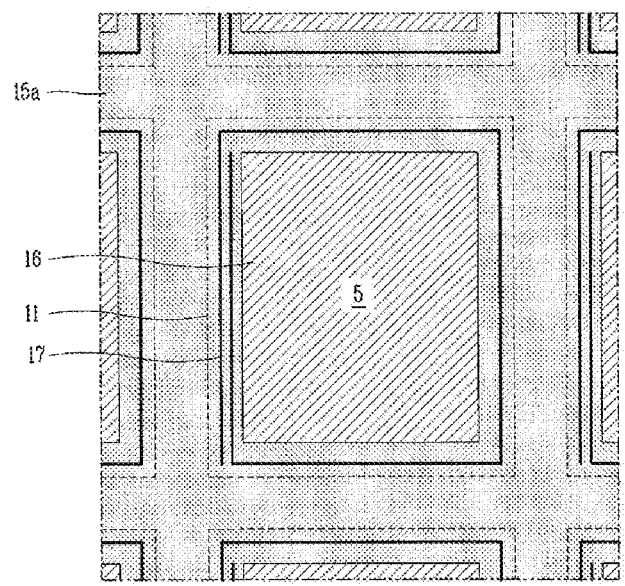
FIG. 5 is an enlarged view illustrating a part of an illuminating unit according to a comparative example.
Figure 6:
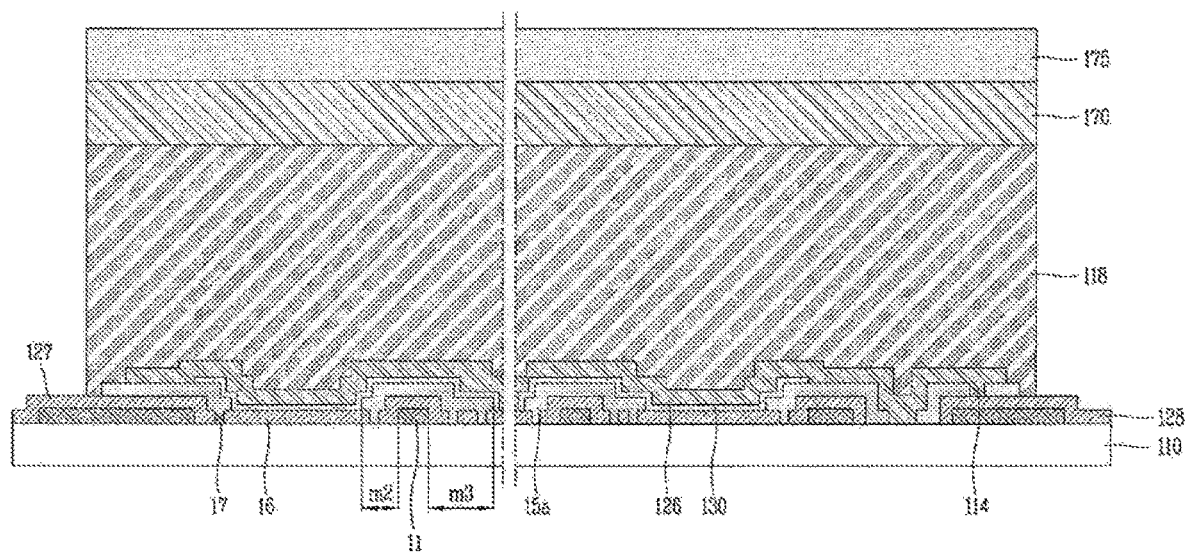
FIG. 6 is a cross-sectional view illustrating a lighting apparatus of a comparative example.

FIG. 5 is an enlarged view illustrating a part of an illuminating unit according to a comparative example and FIG. 6 is a cross-sectional view illustrating a lighting apparatus of a comparative example.

In the present disclosure, a lighting apparatus using an organic light emitting diode formed of an organic material is provided rather than a lighting apparatus using an inorganic light emitting diode formed of an inorganic material.

The organic light emitting diode formed of an organic light emitting material has relatively excellent luminance efficiencies of red and green light as compared with an inorganic light emitting diode. Further, widths of emission peaks of red, green, and blue light of the organic light emitting diode are relatively broader than that of the inorganic light emitting diode so that a color rendering index is improved. Therefore, there is an advantage in that light of the light emitting device is more similar to the sunlight.

In the following description, although the lighting apparatus of the present disclosure is described as a bendable lighting apparatus having flexibility, the present disclosure may be applied not only to the bendable lighting apparatus, but also to a normal lighting apparatus which is not bendable.

Referring to FIGS. 1 to 4, a lighting apparatus 100 using an organic light emitting diode according to a first exemplary aspect of the present disclosure includes an organic light emitting diode unit 101 in which surface emission is performed and an encapsulating unit 102 which encapsulates the organic light emitting diode unit 101.

In this case, an external light extracting layer 145 for increasing a haze may be additionally provided below the organic light emitting diode unit 101. However, the present disclosure is not limited thereto and the external light extracting layer may not be provided.

The external light extracting layer 145 is configured such that scattering particles such as TiO2 are dispersed in a resin and may be attached below a substrate 110 by means of an adhering layer (not illustrated).

The organic light emitting diode unit 101 is formed of an organic light emitting diode provided on the substrate 110 and an internal light extracting layer 140 may be further provided between the substrate 110 and the organic light emitting diode. However, the present disclosure is not limited thereto and the internal light extracting layer may not be provided.

A planarization layer (not illustrated) may be further provided above the internal light extracting layer 140.

In this case, the substrate 110 may include an illuminating unit EA which emits actual light to output the light to the outside and contact units CA1 and CA2 which are electrically connected to the outside through contact electrodes 127 and 128 to apply a signal to the illuminating unit EA.

The contact units CA1 and CA2 are not blocked by an encapsulating unit and/or a protective film 175 of the metal film 170 to be electrically connected to the outside through the contact electrodes 127 and 128. Therefore, the metal film 170 and/or the protective film 175 may be attached to the entire surface of the illuminating unit EA of the substrate 110 excluding the contact units CA1 and CA2, but the present disclosure is not limited thereto.

In this case, the contact units CA1 and CA2 may be located outside the illuminating unit EA. In FIG. 2, although it is illustrated that the second contact unit CA2 is located between the first contact units CA1, the present disclosure is not limited thereto.

Further, in FIG. 2, although it is illustrated that the contact units CA1 and CA2 are located only at one outside of the illustrating unit EA, the present disclosure is not limited thereto. Therefore, the contact units CA1 and CA2 of the present disclosure may be disposed in all an upper portion, a lower portion, and the outside of the illuminating unit EA.

A first electrode 116 and a second electrode 126 are disposed above the substrate 110 and an organic light emitting layer 130 is disposed between the first electrode 116 and the second electrode 126 to form an organic light emitting diode. In the lighting apparatus 100 having the above-described structure, a current is applied to the first electrode 116 and the second electrode 126 to cause the organic light emitting layer 130 to emit light so that light is output through the illuminating unit EA.

The organic light emitting layer 130 may be configured by a light emitting layer which emits white light. For example, the organic light emitting layer 130 may be configured by a blue light emitting layer, a red light emitting layer, and a green light emitting layer or may be configured by a tandem structure including a blue light emitting layer and a yellow-green light emitting layer. However, the organic light emitting layer 130 of the present disclosure is not limited to the above-described structure and various structures may be applied therefor.

Further, the organic light emitting layer 130 of the present disclosure may further include an electron injection layer and a hole injection layer which inject electrons and holes to the light emitting layer, respectively, and an electron transport layer and a hole transport layer which transport the injected electrons and holes to the light emitting layer, respectively, and a charge generating layer which generates charges such as electrons and holes.

However, in the contact units CA1 and CA2 at an outer edge of the illuminating unit EA, a first protective layer 115a, the organic light emitting layer 130, and the second electrode 126 are not formed so that the contact electrodes 127 and 128 may be exposed to the outside.

In this case, even though not illustrated in the drawing, a second protective layer of an organic material and a third protective layer of an inorganic material may be formed in the illuminating unit EA to cover the organic light emitting layer 130 and the second electrode 126.

Generally, when polymer constituting the organic light emitting material is coupled to moisture, the emission characteristic is rapidly deteriorated so that the luminous efficiency of the organic light emitting layer 130 is lowered. Specifically, when a part of the organic light emitting layer 130 in the lighting apparatus 100 is exposed to the outside, moisture propagates into the lighting apparatus 100 along the organic light emitting layer 130 to deteriorate the luminous efficiency of the lighting apparatus 100. Therefore, in the present disclosure, the second protective layer and the third protective layer are formed to cover the organic light emitting layer 130 and the second electrode 126 of the illuminating unit EA so that the moisture cannot permeate into the organic light emitting layer 130 of the illuminating unit EA of the lighting apparatus 100 from which actual light is emitted to be output. Therefore, the yield is improved so that a manufacturing cost is saved and the reliability is ensured.

As described above, the first electrode 116 including the first contact electrode 127 and the second contact electrode 128 are disposed on the substrate 110 which is formed of a transparent material. A rigid material such as glass may be used for the substrate 110. However, a material having flexibility such as plastic is used to manufacture a bendable lighting apparatus 100. Further, in the present disclosure, a plastic material having flexibility is used for the substrate 110 so that a process using a roll can be performed. Therefore, the lighting apparatus 100 may be quickly manufactured.

The first electrode 116 including the first contact electrode 127 and the second contact electrode 128 are formed in the illuminating unit EA and the first and second contact units CA1 and CA2. The first electrode 116 may be divided into a first-first electrode 116a having a relatively high resistance and a second-first electrode 116b having a relatively low resistance. The first-first electrode 116a and the second-first electrode 116b may be configured by a transparent conductive layer having a higher resistance than transparent conductive oxide (TCO) such as indium tin oxide (ITO) of the conventional art. Therefore, it is assumed that the first-first electrode 116a and the second-first electrode 116b are configured by a transparent high resistance conductive layer for the convenience of description.

The first-first electrode 116a is formed on an auxiliary electrode 111 to cover the auxiliary electrode 111 and the second-first electrode 116b may be formed in an emission area (105 in FIG. 4) divided by a net type auxiliary electrode 111.

In this case, the first-first electrode 116a of the present disclosure uses a transparent high resistance conductive layer having a sheet resistance of 108 to 109Ω/☐, instead of TCO such as ITO of the conventional art.

That is, in the present disclosure, a transparent high resistance conductive layer such as a conductive polymer, a carbon based material, or a nanowire based material is used as the first-first electrode 116a. Therefore, a lighting failure of the entire panel caused by a short due to foreign materials may be solved without reducing the aperture ratio.

In the lighting apparatus using an organic light emitting diode, when a short is generated between the first electrode 116 and the second electrode 126 due to the foreign materials, the luminance may be lowered not only in the corresponding pixel, but also in the entire panel due to the current drop.

Therefore, in a comparative aspect of FIGS. 5 and 6, a short reduction pattern 17 is formed in the auxiliary electrode 11 which supplies current to the individual pixels to reflect a narrow path and the short reduction pattern 17 is covered by the first protective layer 15a thereon to suppress the short. That is, the short reduction pattern 17 is formed to enclose an outer edge of the emission area 5 of the individual pixel and adds resistance to the individual pixels to restrict current flowing in an area where the short is generated.

In this case, the first electrode 16 of the comparative aspect is formed of TCO such as ITO.

However, in this case, there is a disadvantage in that the entire aperture ratio is reduced by approximately 8.5% due to the addition of the short reduction pattern 17 in the individual pixel. That is, in the comparative aspect, the short reduction pattern 17 is added to the outer edge of the emission area 5 so that minimum margins m2 and m3 of the first protective layer 15a are increased to approximately 14 μm and 22 μm, respectively.

Therefore, the present disclosure suggests a method which uses a transparent high resistance conductive layer having a sheet resistance of 108 to 109Ω/☐ for the first-first electrode 116a, instead of ITO of the conventional art, without adding the short reduction pattern, to control the concentrated current due to the short by increasing the resistance of the first-first electrode 116a. In this case, the short reduction pattern may be removed so that the minimum margin m1 is reduced to approximately 5.4 μm as compared with the conventional art, so that the aperture ratio may be improved.

As described above, a conductive polymer, a carbon based material, or a nanowire based material may be used for the transparent high resistance conductive layer.

Among them, the conductive polymer material may include a solvent, a binder, and other additives in addition to the conductive material. In this case, the conductive material may include 1 to 10% of poly(3,4-ethylenedioxythiophene) polystyrene sulfonate (PEDOT:PSS).

The solvent may include 80 to 90% of water or alcohol and the binder may include 10 to 20% of a silicon or acrylic material such as tetraethyl orthosilicate (TEOS), SSQ, or polysiloxane.

Approximately 1% of a leveling agent or a surfactant may be included as the additives.

Further, the carbon based material may include graphene, a single walled carbon nanotube (SWCNT), or a multi-walled CNT (MWCNT) as a conductive material.

The nanowire based material may include copper nanowire (CuNW), AgNW, or AuNW as a conductive material.

As described above, the transparent high resistance conductive layer of the present disclosure configured by adding a conductive core such as a conductive polymer, a carbon based material, or a nanowire based material to a silicon oxide base using TEOS may adjust the resistance from several Ω/☐ to 109Ω/☐ or higher in accordance with a content wt % of the conductive core.

As compared with ITO (=30 to 50 nm) of the conventional art, a thickness of the transparent high resistance conductive layer of the present disclosure may be 150 to 200 nm when the conductive polymer is applied and may be 50 to 100 nm when the carbon based material is applied.

Further, in the first and second contact electrodes 127 and 128 and the second-first electrode 116b of the present disclosure, the resistance is lowered to be 103 to 104Ω/☐ by performing a post-treatment on the transparent high resistance conductive layer of the first-first electrode 116a, thereby suppressing the deterioration of the luminance of the panel. That is, when the second-first electrode 116b is formed of the transparent high resistance conductive material, similarly to the first-first electrode 116a, the luminance may be lowered due to current drop. However, the resistance is adjusted (to 103 to 104Ω/☐) through the post-treatment such as a thermal treatment by plasma or laser so that a normal luminance may be ensured.

In this case, the first-first electrode 116a is blocked by the first protective layer 115a, excluding the second-first electrode 116b of the emission area 105, so that the post-treatment is not performed thereon. Therefore, in the first-first electrode 116a, the original resistance value (108 to 109Ω/☐) may be maintained. However, the present disclosure is not limited thereto and instead of the post-treatment, the content of the conductive core is adjusted as described above, so that the first-first electrode 116a and the second-first electrode 116b may be formed by transparent high resistance conductive layers having different resistance values, respectively.

Figures 7, 8:
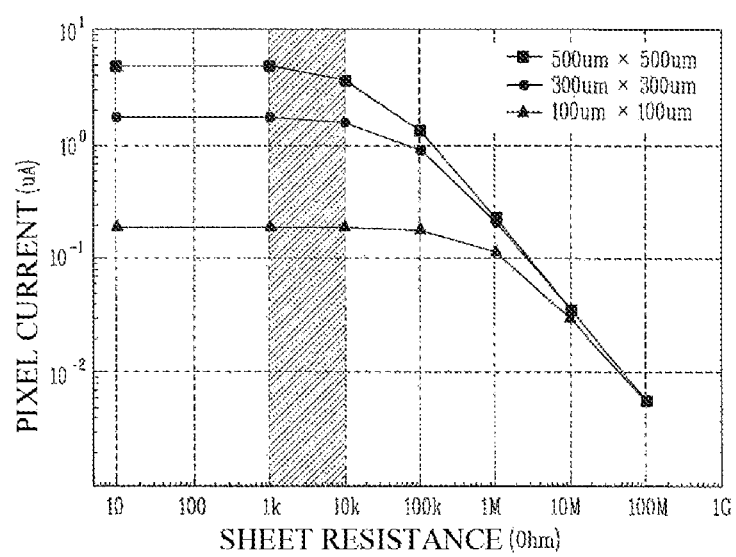
FIG. 7 is a view illustrating a resistance change according to a thermal treatment condition of a transparent high resistance conductive layer.
FIG. 8 is a graph illustrating a relationship of a sheet resistance and a pixel current of a thermally-treated conductive layer.

FIG. 7 is a view illustrating a resistance change according to a thermal treatment condition of a transparent high resistance conductive layer as an example.

In this case, FIG. 7 illustrates a resistance change after forming a transparent high resistance layer by means of a slit coating method with an ejection amount of 100 to 500 μl/s and performing a thermal treatment five times at every twenty minutes at a temperature of 150° C. and 250° C. in an oven.

FIG. 8 is a graph illustrating a relationship of a sheet resistance and a pixel current of a thermally-treated conductive layer. In this case, FIG. 8 illustrates a relationship between a sheet resistance of the thermally treated conductive layer and a pixel current with respect to pixels having sizes of 500×500 μm, 300×300 μm, and 100×100 μm as an example.

Referring to FIG. 7, as a result of repeatedly performing the thermal treatment on the transparent high resistance conductive layer, it is confirmed that the resistance is reduced (to 105Ω/☐) as compared with an initial resistance (107 to 108Ω/☐). However, it is understood that when the transparent high resistance conductive layer is formed to have a specific thickness (718 nm) or larger, crack is generated in the transparent high resistance conductive layer.

Specifically, it is understood that when the thermal treatment is performed at a high temperature of 250° C. or higher, the resistance is apparently reduced. For example, it is understood that when the transparent high resistance conductive layer having a thickness of approximately 396 nm is subject to a thermal treatment for 20, 40, 60, 80, and 100 minutes at a temperature of 250° C., the sheet resistance is reduced to 105.5, 105.4, 105.3, 105.3, and 105.3Ω/□ from 107.6Ω/□, respectively.

Further, at a thermal treatment temperature of 250° C., when the transparent high resistance conductive layer having a thickness of approximately 124 to 520 nm is subject to a thermal treatment just for 20 minutes, the resistance can be rapidly reduced and as the thermal treatment time is increased to 20 minutes or longer, the resistance is gradually reduced.

Referring to FIG. 8, it is understood that with respect to the pixel having a size of 500×500 μm, the luminance (current) is not lowered and an appropriate resistance which may implement the same effect as the comparative aspect may be within 103 Ω/□.

For example, the pixel current is constantly maintained to approximately 4.90 to 4.75 μA at a sheet resistance of 101 to 103Ω/□. In contrast, the pixel current is reduced to 3.75 μm at a sheet resistance of 104Ω/□ and the pixel current is rapidly reduced to be 0.23 μA or lower at a sheet resistance of 106Ω/□ or higher.

Referring to FIGS. 1 to 4 again, the first electrode 116, as described above, extends to the first contact unit CA1 outside the illuminating unit EA to form the first contact electrode 127. The second contact electrode 128 which is electrically insulated from the first electrode 116 may be disposed in the second contact unit CA2. That is, the second contact electrode 128 is disposed on the same layer as the first electrode 116 but is separated from the first electrode 116 to be electrically insulated.

For example, in FIG. 2, it is illustrated that the first electrode 116 including the first contact electrode 127 is entirely formed to be a quadrangular shape, but an upper center portion is removed to configure a recession and the second contact electrode 128 is disposed in the recession as an example. However, the present disclosure is not limited thereto.

In this case, when the first electrode 116 including the first contact electrode 127 and the second contact electrode 128 of the present disclosure are formed of an organic layer, a coating method may be applied. Therefore, the substrate 110 on which the auxiliary electrode 111 is formed may be planarized.

The auxiliary electrode 111 is disposed in the illumination unit EA and the first contact unit CA1 of the substrate 110 to be electrically connected to the first electrode 116 and the first contact electrode 127. The first electrode 116 is formed of a transparent high resistance conductive layer to have an advantage in that the emitted light transmits the first electrode, but also have a disadvantage in that an electric resistance is very high as compared with an opaque metal. Therefore, when a large size lighting apparatus 100 is manufactured, the distribution of the current applied to a large lighting area is not uniform due to a high resistance of the transparent high resistance conductive layer and the large size lighting apparatus 100 may not emit light with uniform luminance due to the current distribution which is not uniform.

The auxiliary electrode 111 is disposed over the entire illuminating unit EA to have a net type with a small thickness, a mesh type, a hexagonal or an octagonal, or a circular shape to allow a uniform current to be applied to the first electrode 116 of the emission area 105 on the entire illuminating unit EA. Therefore, the light with a uniform luminance may be emitted from the large size lighting apparatus 100.

In this case, the auxiliary electrode 111 according to the present disclosure is formed by nanowire such as AgNW, CuNW, and AuNW, instead of an opaque metal of the conventional art. That is, the auxiliary electrode 111 is formed by AgNW having a transmittance of approximately 90%, instead of an opaque metal having a transmittance of almost 0%, to improve the aperture ratio.

In FIG. 3, it is illustrated that the auxiliary electrode 111 is disposed below the first electrode 116 including the first contact electrode 127 as an example, but the present disclosure is not limited thereto and the auxiliary electrode 111 may be disposed above the first electrode 116 including the first contact electrode 127. The auxiliary electrode 111 disposed in the first contact unit CA1 is used as a current transmitting path to the first electrode 116 through the first contact electrode 127, but may also serve as a contact electrode which is in contact with the outside to apply the external current to the first electrode 116.

The first protective layer 115a may be laminated on the illuminating unit EA of the substrate 110 but the present disclosure is not limited thereto. According to another exemplary aspect (a second exemplary aspect), the first protective layer may not be provided. In FIG. 2, the first protective layer 115a is illustrated to entirely have a quadrangular frame shape having a predetermined width, but in an actual emission area 105, the first protective layer 115a is removed to be formed in the form of a net to cover the auxiliary electrode 111 which is disposed in the form of a net. However, the present disclosure is not limited thereto.

The first protective layer 115a disposed in the illuminating unit EA may be configured to cover the auxiliary electrode 111 and the first-first electrode 116a thereabove.

The first protective layer 115a may be configured by an inorganic material such as SiOx and SiNx. However, the first protective layer 115a may be formed of an organic material such as photoacryl and also formed of a plurality of layers of inorganic materials and organic materials.

The organic light emitting layer 130 and the second electrode 126 may be disposed above the substrate 110 on which the first electrode 116 and the first protective layer 115a are disposed. In this case, a predetermined area of the first protective layer 115a above the second contact electrode 128 located in the illuminating unit EA is removed to form a contact hole 114 which exposes the second contact electrode 128. Therefore, the second electrode 126 may be electrically connected to the second contact electrode 128 therebelow through the contact hole 114.

As described above, the organic light emitting layer 130 is a white light emitting layer and may include a red light emitting layer, a blue light emitting layer, and a green light emitting layer or configured by a tandem structure including a blue light emitting layer and a yellow-green light emitting layer. Further, the organic light emitting layer 130 may further include an electron injection layer and a hole injection layer which inject electrons and holes to the light emitting layer, respectively and an electron transport layer and a hole transport layer which transport the injected electrons and holes to the light emitting layer, respectively, and a charge generating layer which generates charges such as electrons and holes.

As for the second electrode 126, a material having a low work function is desirable so as to easily inject electrons into the organic light emitting layer 130. A specific example of the material used for the second electrode 126 includes metals such as magnesium, calcium, sodium, titanium, indium, yttrium, lithium, gadolinium, aluminum, silver, tin, and lead, or an alloy thereof.

The first electrode 116, the organic light emitting layer 130, and the second electrode 126 of the illuminating unit EA configure the organic light emitting diode. In this case, the first electrode 116 is an anode of the organic light emitting diode and the second electrode 126 is a cathode. When the current is applied to the first electrode 116 and the second electrode 126, the electrons from the second electrode 126 are injected into the organic light emitting layer 130 and the holes from the first electrode 116 are injected into the organic light emitting layer 130. Thereafter, excitons are generated in the organic light emitting layer 130. As the excitons are decayed, light corresponding an energy difference of a lowest unoccupied molecular orbital (LUMO) and a highest occupied molecular orbital (HOMO) of the light emitting layer is generated to be radiated in a lower direction (toward the substrate 110 in the drawing).

In this case, in the first exemplary aspect of the present disclosure, the first protective layer 115a is disposed above the auxiliary electrode 111 of the illuminating unit EA so that the organic light emitting layer 130 above the auxiliary electrode 111 is not in direct contact with the first electrode 116. Therefore, the organic light emitting diode is not formed above the auxiliary electrode 111. That is, the organic light emitting diode in the illuminating unit EA, for example, is formed only in the emission area 105 in the auxiliary electrode 111 formed in the form of a net. However, also in this case, since the auxiliary electrode 111 is configured by the transparent nanowire, light generated from the emission area 105 may transmit the auxiliary electrode 111 therearound so that the aperture ratio is substantially improved.

In this case, even though it is not illustrated, the second protective layer and the third protective layer may be provided on the substrate 110 on which the second electrode 126 is formed.

The second protective layer according to the first exemplary aspect of the present disclosure is formed to cover the organic light emitting layer 130 and the second electrode 126 of the illuminating unit EA as described above to suppress the moisture from permeating into the organic light emitting layer 130 of the illuminating unit EA.

That is, in the present disclosure, in addition to an encapsulating unit of an adhesive agent 118 and a metal film 170, the second protective layer and the third protective layer are formed to cover the organic light emitting layer 130 and the second electrode 126 of the illuminating unit EA so that the moisture cannot permeate into the organic light emitting layer 130 of the illuminating unit EA of the lighting apparatus 100 from which actual light is emitted to be output.

The second protective layer may be configured by an organic material such as photoacryl and the third protective layer may be configured by an inorganic material such as SiOx and SiNx. However, the present disclosure is not limited thereto.

A predetermined encapsulation agent may be provided above the third protective layer. The encapsulation agent may use an epoxy compound, an acrylate compound, or an acrylic compound.

As described above, the first contact electrode 127 extending from the first electrode 116 is exposed to the outside on the substrate 110 of the first contact unit CA1. Further, the second contact electrode 128 which is electrically connected to the second electrode 126 through the contact hole 114 is exposed to the outside on the substrate 110 of the second contact unit CA2. Therefore, the first contact electrode 127 and the second contact electrode 128 are electrically connected to an external power supply to apply the current to the first electrode 116 and the second electrode 126.

An adhesive agent 118 such as a pressure sensitive adhesive (PSA) may be applied on the third protective layer and the metal film 170 is disposed thereon so that the metal film 170 is attached to the third protective layer to seal the lighting apparatus 100.

In this case, the encapsulating unit of the adhesive agent 118 and the metal film 170 may be attached to sufficiently cover the second protective layer and the third protective layer.

Further, a predetermined protective film 175 may be attached to the entire surface of the illuminating unit EA of the substrate 110 excluding the contact units CA1 and CA2.

The adhesive agent 118 may use a photo-curing adhesive or a thermosetting adhesive.

Hereinafter, a manufacturing method of a lighting apparatus using an organic light emitting diode according to a first exemplary aspect of the present disclosure will be described in detail with reference to the drawings.

FIGS. 9A to 9G are plan views sequentially illustrating a manufacturing method of a lighting apparatus using an organic light emitting diode according to a first exemplary aspect of the present disclosure illustrated in FIG. 2.

FIGS. 10A to 10G are cross-sectional views sequentially illustrating a manufacturing method of a lighting apparatus using an organic light emitting diode according to a first exemplary aspect of the present disclosure illustrated in FIG. 3.

Figure 9A:
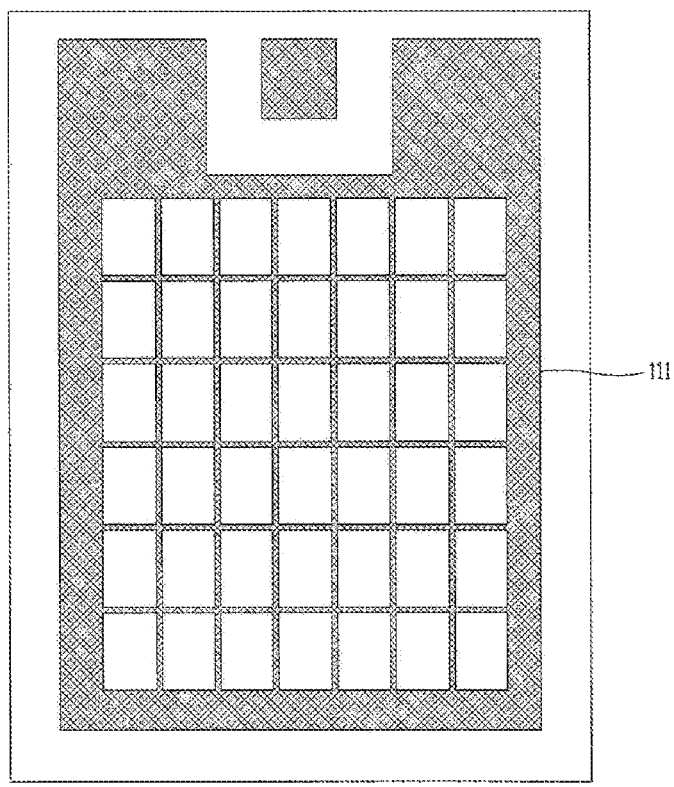
FIGS. 9A to 9G are plan views sequentially illustrating a manufacturing method of a lighting apparatus using an organic light emitting diode according to a first exemplary aspect of the present disclosure illustrated in FIG. 2.
Figure 10A:
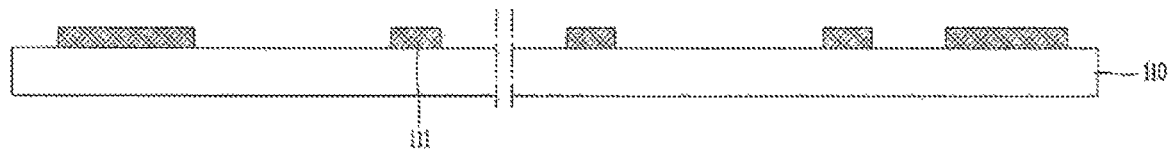
FIGS. 10A to 10G are cross-sectional views sequentially illustrating a manufacturing method of a lighting apparatus using an organic light emitting diode according to a first exemplary aspect of the present disclosure illustrated in FIG. 3.

First, referring to FIGS. 9A and 10A, an auxiliary electrode 111 which is formed of nanowire such as AgNW, CuNW and AuNW is formed in an illuminating unit and first and second contact units of the substrate 110.

As described above, the auxiliary electrode 111 according to the present disclosure is formed by AgNW having a transmittance of approximately 90%, instead of an opaque metal having a transmittance of almost 0%, to improve the aperture ratio. That is, since the auxiliary electrode 111 is configured by the transparent nanowire instead of the opaque metal of the conventional art, light generated from the emission area may transmit the auxiliary electrode 111 therearound so that the aperture ratio is substantially improved.

Even though it is not illustrated in the drawings, before forming the auxiliary electrode 111 on the substrate 110, a predetermined buffer layer and an internal light extracting layer may be formed on the entire surface of the substrate 110.

Further, the auxiliary electrode 111 is disposed over the entire illuminating unit to have a net type with a small thickness (shown in FIG. 9A), a mesh type, a hexagonal or octagonal, or a circular shape.

Figure 9B:
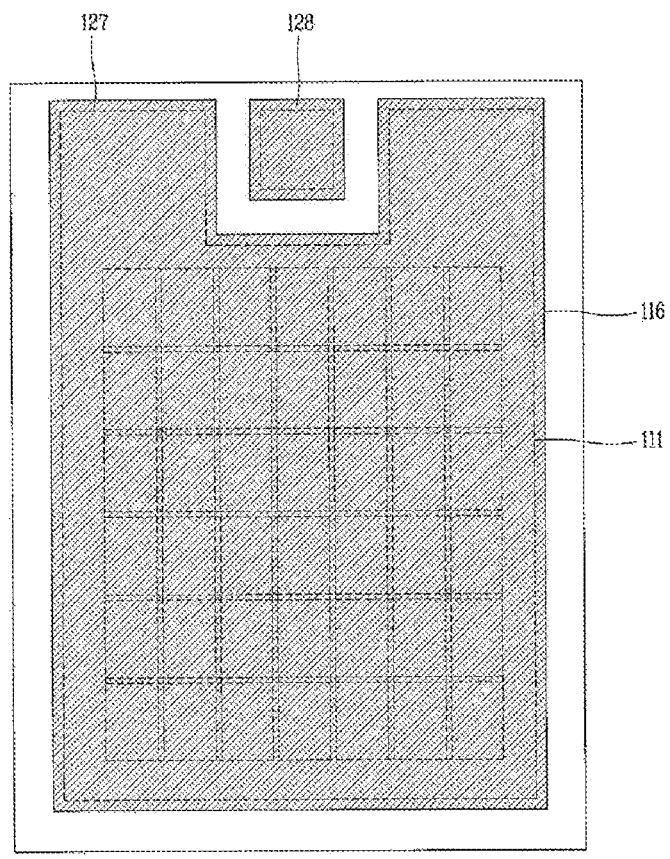
Figure 10B:
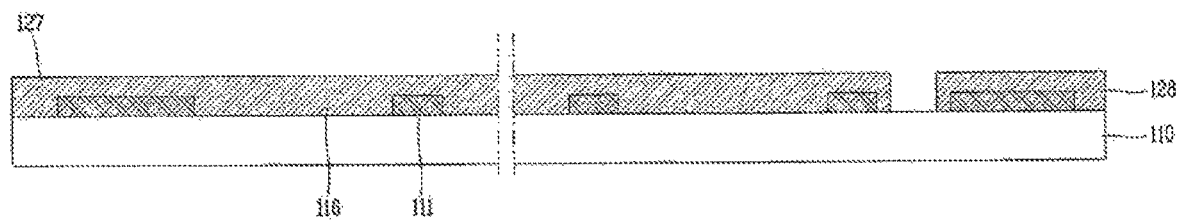

Therefore, referring to FIGS. 9B and 10B, a transparent high resistance conductive layer is laminated over the entire substrate 110.

In this case, as described above, a conductive polymer, a carbon based material, or a nanowire based material may be used for the transparent high resistance conductive layer.

The conductive polymer material may include a solvent, a binder, and other additives in addition to the conductive material. In this case, 1 to 10% PEDOT:PSS may be included as the conductive material.

The solvent may include 80 to 90% of water or alcohol and the binder may include 10 to 20% of a silicon or acrylic material such as tetraethyl orthosilicate (TEOS), SSQ, or polysiloxane.

Approximately 1% of a leveling agent or surfactant may be included as the additives.

Further, the carbon based material may include graphene, a single-walled carbon nanotube or a multiple-walled carbon nanotube as a conductive material.

The nanowire based material may include CuNW, AgNW, or AuNW as a conductive material.

In this case, the transparent high resistance conductive layer of the present disclosure may adjust the resistance from several $\Omega/\square$ to $109\Omega/\square$ or higher in accordance with a content wt % of the conductive polymer, the carbon based material, or the nanowire based material. For example, the sheet resistance may be adjusted to be 108 to 109 $\Omega/\square$.

As described above, in the present disclosure, a transparent high resistance conductive layer having a sheet resistance of 108 to $109\Omega/\square$ is used, instead of ITO of the conventional art, without adding the short reduction pattern, to control the concentrated current due to the short by increasing the resistance of the first electrode. In this case, the short reduction pattern is removed so that the aperture ratio may be improved.

Further, as described above, the transparent high resistance conductive layer of the present disclosure may be formed by applying a coating method and thus the substrate 110 on which the auxiliary electrode 111 is formed may be planarized. In this case, a failure such as seam or short which may be generated at a tapered portion of the auxiliary electrode 111 may be minimized.

Thereafter, the transparent high resistance conductive layer is selectively etched to form the first electrode 116 including the first contact electrode 127 and the second contact electrode 128 in the illuminating unit and the first and second contact units.

In this case, the first electrode 116 extends to the first contact unit outside the illuminating unit to configure the first contact electrode 127 and the second contact electrode 128 which is electrically insulated from the first electrode 116 may be formed in a part of the illuminating unit and the second contact unit. That is, the second contact electrode 128 is formed on the same layer as the first electrode 116 but is separated from the first electrode 116 to be electrically insulated therefrom.

For example, in FIG. 9B, it is illustrated that the first electrode 116 including the first contact electrode 127 is entirely formed to be a quadrangular shape, but an upper center portion is removed to configure a recession and the second contact electrode 128 is formed in the recession as an example. However, the present disclosure is not limited thereto.

In this case, in FIG. 10B, it is illustrated that the auxiliary electrode 111 is disposed below the first electrode 116 including the first contact electrode 127 as an example, but the present disclosure is not limited thereto and the auxiliary electrode 111 may be formed above the first electrode 116 including the first contact electrode 127. The auxiliary electrode 111 disposed in the first contact unit is used as a current transmitting path to the first electrode 116, but may also serve as a contact electrode which is in contact with the outside to apply the external current to the first electrode 116.

Figure 9C:
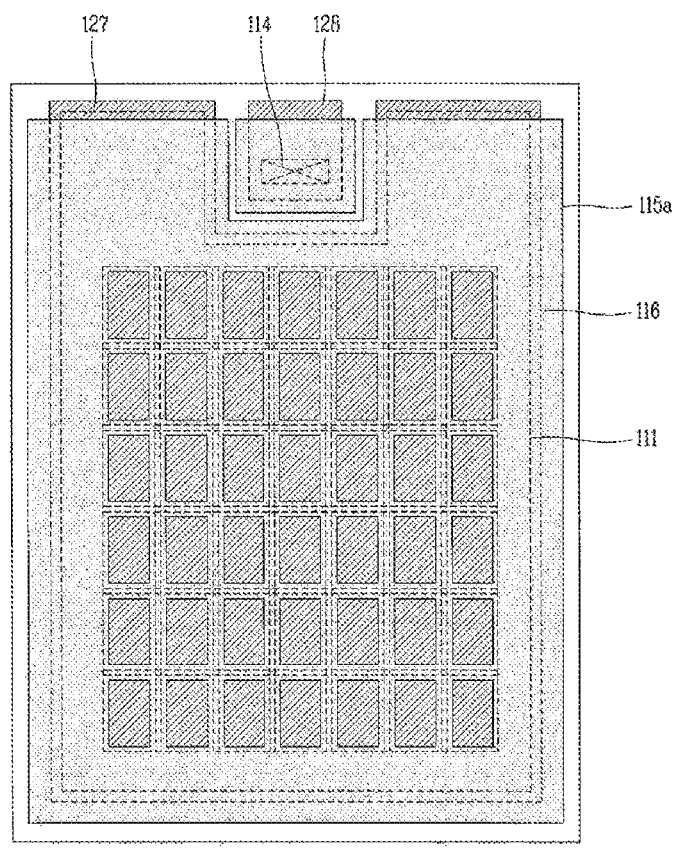
Figure 10C:
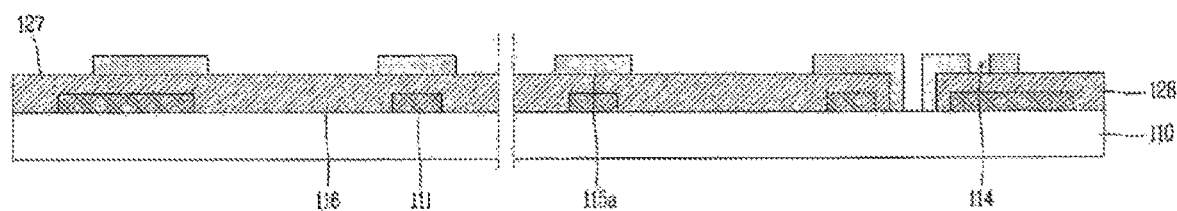

Referring to FIGS. 9C and 10C, an inorganic material such as SiNx and SiOx or an organic material such as photoacryl is laminated over the entire substrate 110. Thereafter, the inorganic material or the organic material is etched to form the first protective layer 115a on an upper portion and a side portion of the auxiliary electrode 111 of the illuminating unit and a contact hole 114 which exposes a part of the second contact electrode 128.

In this case, the first protective layer 115a is formed above the first electrode 116 to cover the auxiliary electrode 111 but is not formed in the emission area where the light is actually emitted (however, referring to FIG. 9C, the first protective layer 115a may be formed in the form of a net at a center of the illuminating unit to cover the auxiliary electrode 111 disposed in the form of a net). In FIG. 9C, the first protective layer 115a entirely has a quadrangular frame shape having a predetermined width, but actually, at the center of the illuminating unit, the first protective layer 115a is formed in the form of a net to cover the auxiliary electrode 111 which is disposed in the form of a net. Further, in FIG. 9C, it is illustrated that the first protective layer 115a above the first electrode 116 and the first protective layer 115a above the second contact electrode 128 are formed to be separated (cut) from each other as an example, but the present disclosure is not limited thereto.

Figure 9D:
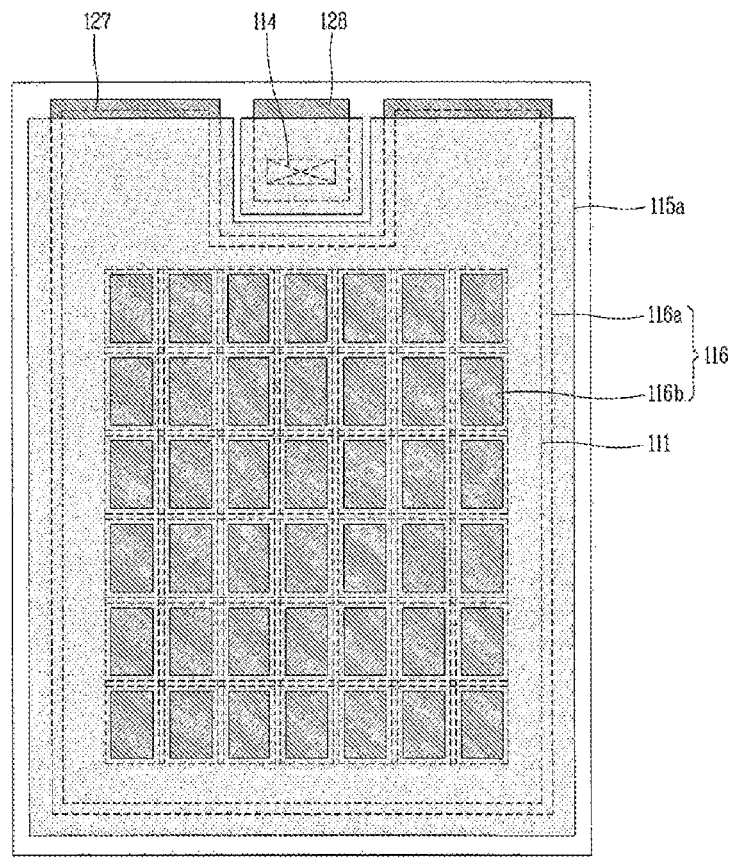
Figure 10D:
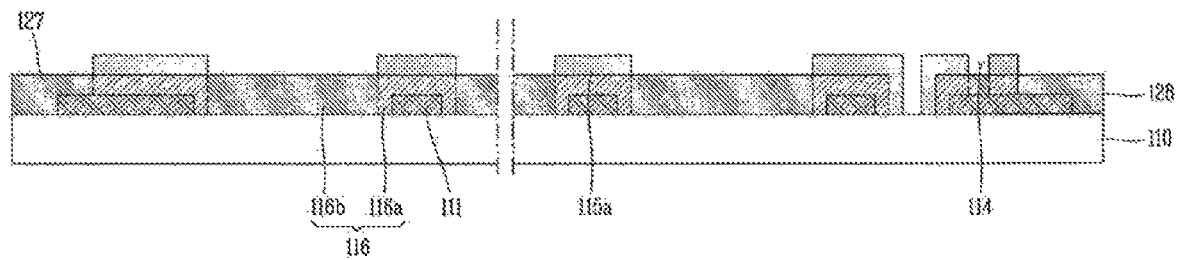

Thereafter, referring to FIGS. 9D and 10D, a post-treatment is performed on the first and second contact electrodes 127 and 128 and the first electrode 116 of the emission area which are opened by removing the first protective layer 115a to lower the sheet resistance of the transparent conductive layer to be 103 to $104\Omega/\square$. As a result, the first electrode 116 may be divided into a first-first electrode 116a having a relatively high resistance and a second-first electrode 116b having a relatively low resistance. The first-first electrode 116a is formed on an auxiliary electrode 111 to cover the auxiliary electrode 111 and the second-first electrode 116b may be formed in an emission area divided by a net type auxiliary electrode 111.

As described above, according to the present disclosure, the first and second contact electrodes 127 and 128 and the first electrode 116 of the emission area are subject to the post-treatment to lower the resistance to 103 to $104\Omega/\square$, thereby suppressing the lowering of the luminance of the panel. That is, in the emission area, there is a possibility of the lowering of the luminance due to the current drop by the high resistance conductive layer, but the resistance is adjusted (103 to $104\Omega/\square$) through the post-treatment such as a thermal treatment by plasma or laser, so that the normal luminance may be ensured.

In this case, as described above, the first electrode 116 in the non-emission area excluding the emission area, that is, the first-first electrode 116a is not subject to the post-treatment so that the original resistance value (108 to $109\Omega/\square$) may be maintained.

Referring to FIGS. 9E and 9F and 10E and 10F, an organic light emitting layer 130 and a second electrode 126 which are formed of an organic light emitting material and metal, respectively, are formed in the illuminating unit of the substrate 110.

Figure 9E:
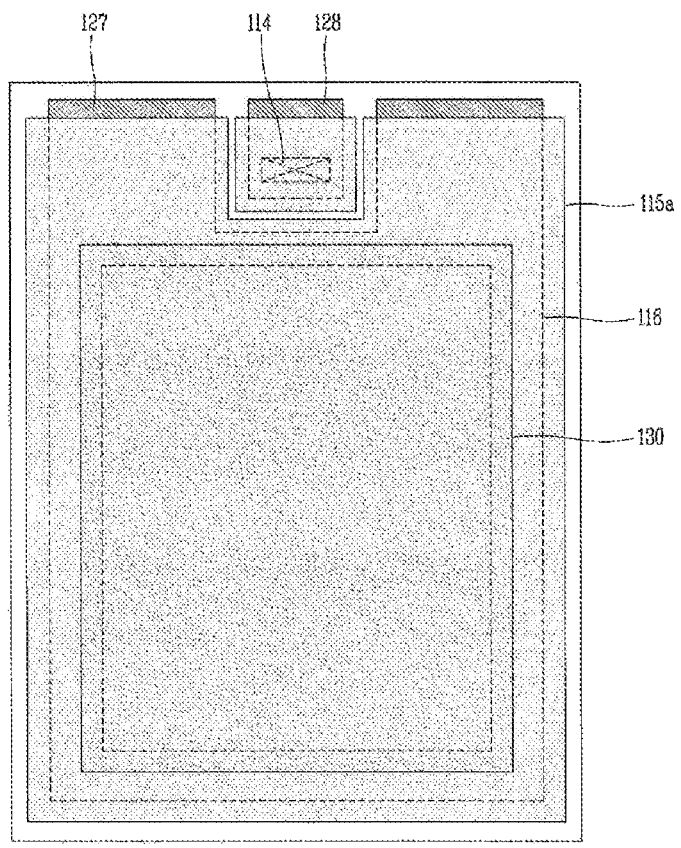
Figure 10E:
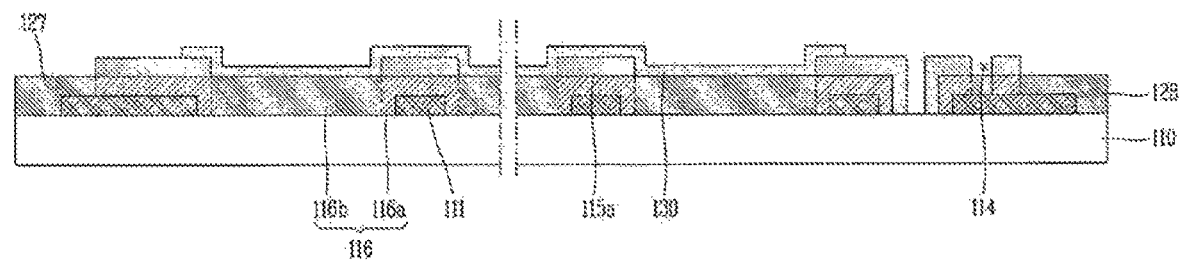

First, referring to FIGS. 9E and 10E, the organic light emitting layer 130 formed of the organic light emitting material is formed in the illuminating unit of the substrate 110.

In this case, the organic light emitting layer 130 is a white light emitting layer and may be configured by a red light emitting layer, a blue light emitting layer, and a green light emitting layer or a tandem structure including a blue light emitting layer and a yellow-green light emitting layer. Further, the organic light emitting layer 130 may further include an electron injection layer and a hole injection layer which inject electrons and holes to the light emitting layer, respectively and an electron transport layer and a hole transport layer which transport the injected electrons and holes to the light emitting layer, respectively, and a charge generating layer which generates charges such as electrons and holes.

Figure 9F:
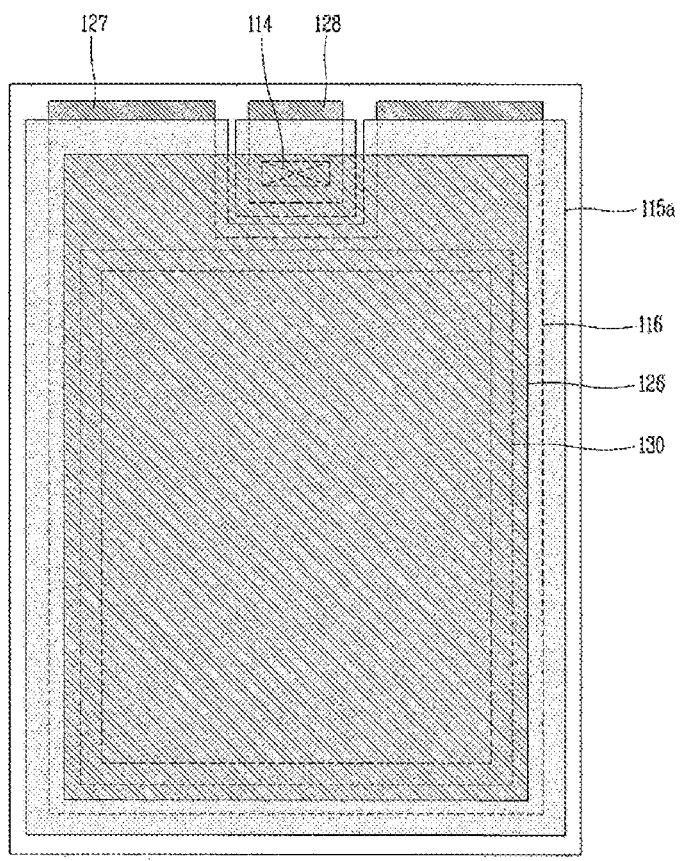
Figure 10F:
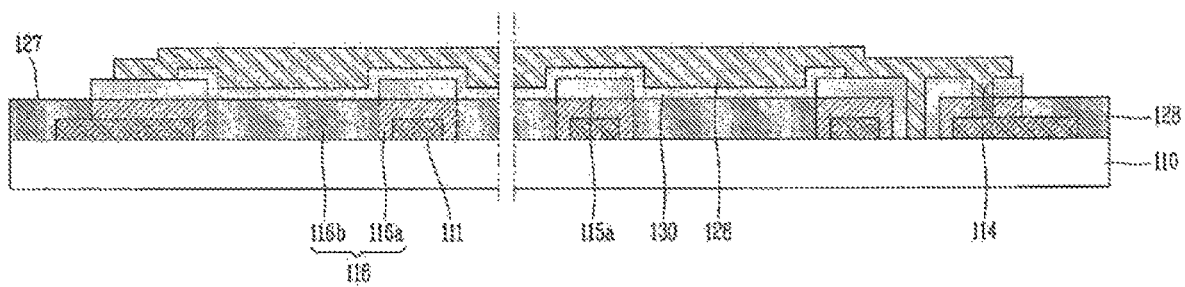

Next, referring to FIGS. 9F and 10F, the second electrode 126 which is formed of metal is formed to cover the organic light emitting layer 130 in the illuminating unit of the substrate 110.

In this case, the second electrode 126 may be electrically connected to the second contact electrode 128 therebelow through the contact hole 114.

The second electrode 126 may be formed by metals such as magnesium, calcium, sodium, titanium, indium, yttrium, lithium, gadolinium, aluminum, silver, tin, and lead, or an alloy thereof.

The first electrode 116, the organic light emitting layer 130, and the second electrode 126 of the illuminating unit configure the organic light emitting diode.

In this case, the first protective layer 115a is disposed above the auxiliary electrode 111 of the illuminating unit so that the organic light emitting layer 130 above the auxiliary electrode 111 is not in direct contact with the first electrode 116. Therefore, the organic light emitting diode is not formed above the auxiliary electrode 111. However, also in the first exemplary aspect of the present disclosure, since the auxiliary electrode 111 is configured by the transparent nanowire, light generated from the emission area may transmit the auxiliary electrode 111 therearound so that the aperture ratio is substantially improved.

Next, even though it is not illustrated, the second protective layer which is formed of an organic material may be formed in the illuminating unit of the substrate 110 to cover the organic light emitting layer 130 and the second electrode 126.

In this case, the second protective layer is formed to cover the organic light emitting layer 130 and the second electrode 126 of the illuminating unit as described above to suppress the moisture from permeating into the organic light emitting layer 130 of the illuminating unit.

The organic light emitting layer 130, the second electrode 126, and the second protective layer may be formed to be in-line with each other through a roll manufacturing apparatus, but the present disclosure is not limited thereto.

Next, a third protective layer may be formed in the illuminating unit of the substrate 110 to cover the second protective layer.

The third protective layer may be formed through another roll manufacturing apparatus.

The third protective layer may be configured by an inorganic material such as SiOx or SiNx, but the present disclosure is not limited thereto.

A predetermined encapsulation agent may be further provided above the third protective layer. The encapsulation agent may use an epoxy compound, an acrylate compound, or an acrylic compound.

Figure 9G:
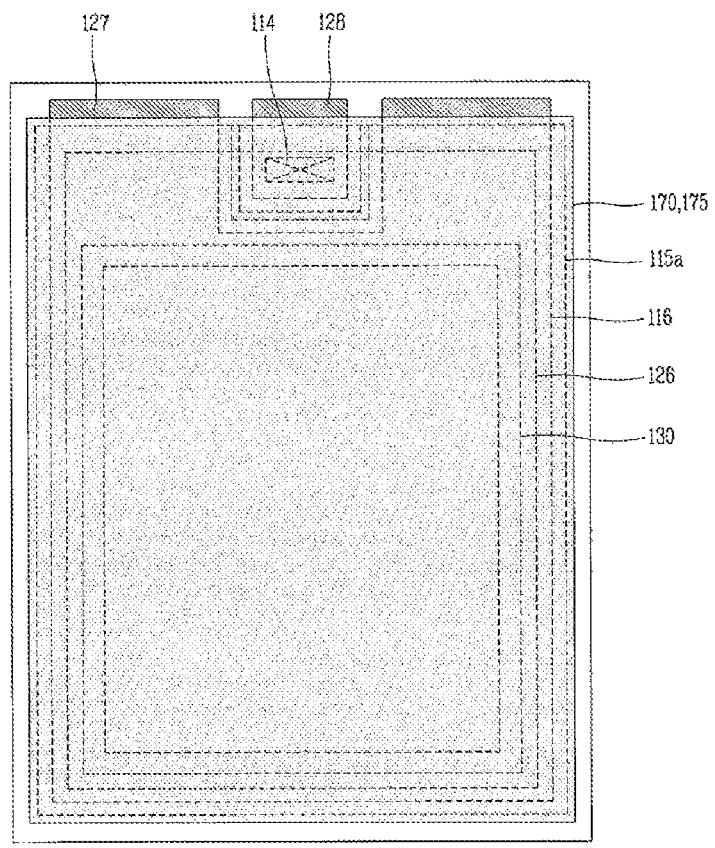
Figure 10G:
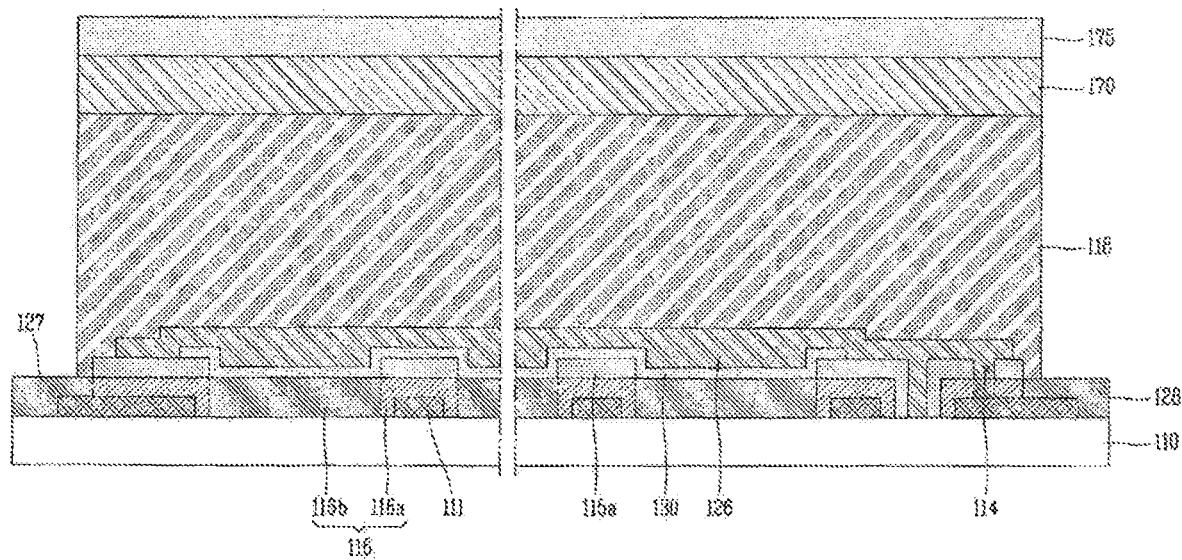

Next, referring to FIGS. 9G and 10G, an adhesive agent 118 configured by a photo-curing adhesive material or a thermosetting adhesive material is applied on the illuminating unit of the substrate 110. After positioning the metal film 170 thereon, the adhesive agent 118 is cured to attach the metal film 170.

In this case, the first and second contact units are not blocked by the encapsulation unit of the metal film 170 so as to be electrically connected to the outside through the first and second contact electrodes 127 and 128.

Thereafter, a predetermined protective film 175 is attached on the entire surface of the illuminating unit of the substrate 110 excluding the contact unit to complete the lighting apparatus.

As described above, according to the present disclosure, a transparent high resistance conductive layer is used for the first electrode, instead of ITO, to control the concentrated current due to the short and the resistance of the first electrode in the emission area is lowered by the post-treatment to suppress the lowering of the luminance. However, as described above, the present disclosure is not limited thereto and the first electrode of the emission area may be formed of a transparent high resistance conductive layer which has a lower resistance value than that of the first electrode of the non-emission area, instead of the post-treatment. Further, the transparent high resistance conductive layer may be formed by applying a coating method and in this case, the substrate may be advantageously planarized.

Furthermore, as described above, according to the present disclosure, the auxiliary electrode is formed of a transparent nanowire such as AgNW, CuNW and AuNW so that the aperture ratio may be substantially improved.

However, in the case of the first exemplary aspect of the present disclosure described above, the first protective layer is formed above a portion where the auxiliary electrode is formed, so that the organic light emitting diode is not configured in the portion where the auxiliary electrode is formed. Therefore, the portion where the auxiliary electrode is formed may remain as a non-emission area. That is, the current is not supplied around the auxiliary electrode covered by the first protective layer to be a non-emission area so that in spite of the above-described effect, it may affect the aperture ratio of the lighting apparatus.

Therefore, according to a second exemplary aspect of the present disclosure, the auxiliary electrode is formed of a transparent nanowire and a first protective layer above the auxiliary electrode is removed so that the upper portion of the auxiliary electrode is also used as an emission area. Therefore, the aperture ratio may be drastically improved. That is, a first-first electrode which is a high resistance conductive layer is applied instead of the first protective layer and a transparent nanowire is applied as an auxiliary electrode instead of the opaque conductive material, so that light interruption is minimized. In this case, the light interruption due to the auxiliary electrode which is a non-emission area of the conventional art is improved so that the luminance and the lifespan are increased in accordance with improvement of the aperture ratio, which will be described in more detail with reference to the drawings.

Figure 11:
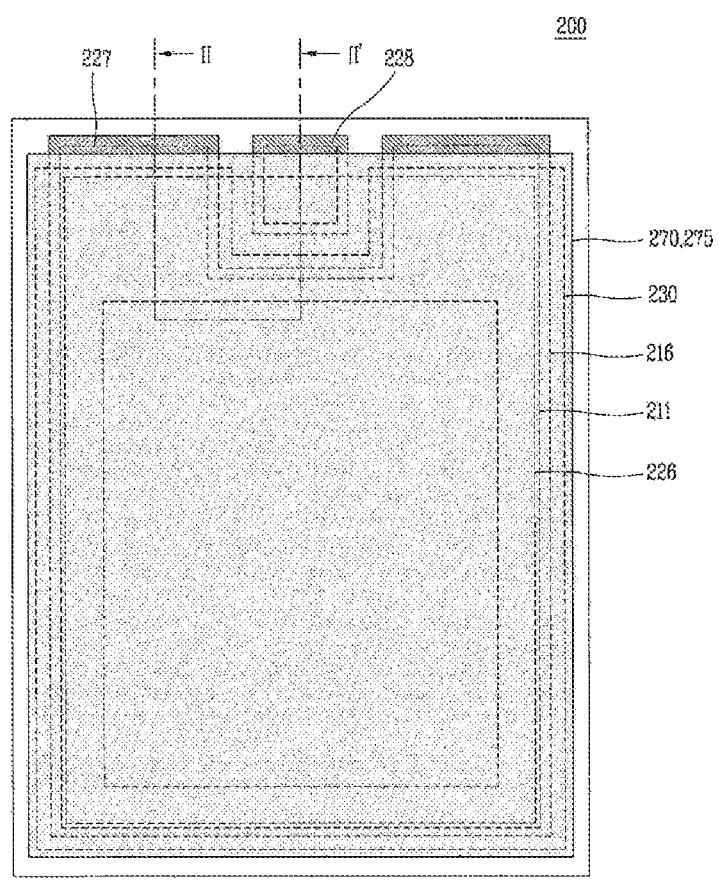
FIG. 11 is a plan view schematically illustrating a lighting apparatus using an organic light emitting diode according to a second exemplary aspect of the present disclosure.

FIG. 11 is a plan view schematically illustrating a lighting apparatus using an organic light emitting diode according to a second exemplary aspect of the present disclosure.

Figure 12:
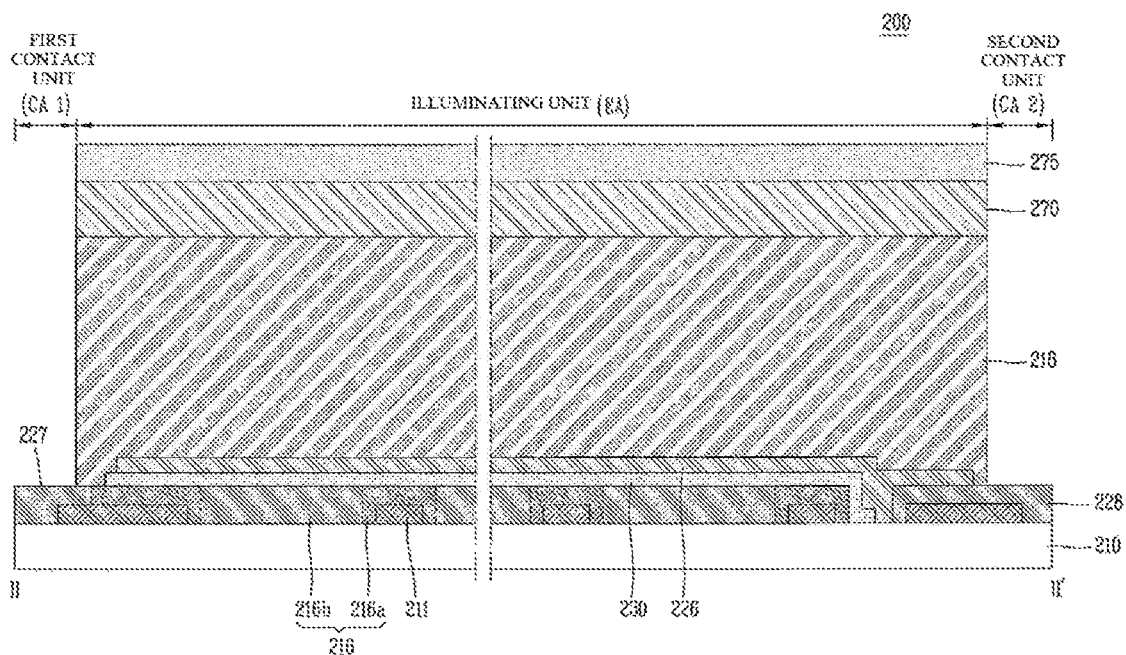
FIG. 12 is a schematic cross-sectional view of a lighting apparatus using an organic light emitting diode according to a second exemplary aspect of the present disclosure taken along line II-II' of FIG. 11.

FIG. 12 is a schematic cross-sectional view of a lighting apparatus using an organic light emitting diode according to a second exemplary aspect of the present disclosure taken along line II-II' of FIG. 11.

A lighting apparatus using an organic light emitting diode according to a second exemplary aspect of the present disclosure illustrated in FIGS. 11 and 12 is substantially the same as the first exemplary aspect of the present disclosure described above, except that the first electrode which is exposed to outside is formed to be enclosed by an organic light emitting layer instead of removing the first protective layer.

That is, the lighting apparatus using an organic light emitting diode according to the second exemplary aspect of the present disclosure may include an organic light emitting diode unit in which surface emission is performed and an encapsulating unit which encapsulates the organic light emitting diode unit.

In this case, an external light extracting layer for increasing a haze may be additionally provided below the organic light emitting diode unit. However, the present disclosure is not limited thereto and the external light extracting layer may not be provided.

The organic light emitting diode unit is configured by an organic light emitting diode provided on the substrate and an internal light extracting layer may be further provided between the substrate and the organic light emitting diode. However, the present disclosure is not limited thereto and the internal light extracting layer may not be provided.

In this case, referring to FIGS. 11 and 12, a substrate 210 may include an illuminating unit EA which emits actual light to output the light to the outside and contact units CA1 and CA2 which are electrically connected to the outside through contact electrodes 227 and 228 to apply a signal to the illuminating unit EA.

The contact units CA1 and CA2 are not blocked by an encapsulating unit and/or a protective film 275 of the metal film 270 to be electrically connected to the outside through the contact electrodes 227 and 228. Therefore, the metal film 270 and/or the protective film 275 may be attached to the entire surface of the illuminating unit EA of the substrate 210 excluding the contact units CA1 and CA2, but the present disclosure is not limited thereto.

A first electrode 216 and a second electrode 226 are disposed above the substrate 210 and an organic light emitting layer 230 is disposed between the first electrode 216 and the second electrode 226 to form an organic light emitting diode. In the lighting apparatus 200 having the above-described structure, a current is applied to the first electrode 216 and the second electrode 226 to cause the organic light emitting layer 230 to emit light so that light is output through the illuminating unit EA.

However, the organic light emitting layer 230 and the second electrode 226 are not formed in the contact units CA1 and CA2 at an outer edge of the illuminating unit EA, so that the contact electrodes 227 and 228 may be exposed to the outside.

In this case, even though not illustrated in the drawing, a second protective layer of an organic material and a third protective layer of an inorganic material may be formed to cover the organic light emitting layer 230 and the second electrode 226.

As described above, the first electrode 216 including the first contact electrode 227 and the second contact electrode 228 are disposed on the substrate 210 which is formed of a transparent material. A rigid material such as glass may be used for the substrate 210. However, a material having flexibility such as plastic is used to manufacture a lighting apparatus 200 which is bendable. Further, in the present disclosure, a plastic material having flexibility is used for the substrate 210 so that a process using a roll can be performed. Therefore, the lighting apparatus 200 may be quickly manufactured.

In this case, the first electrode 216 may be divided into a first-first electrode 216a having a relatively high resistance and a second-first electrode 216b having a relatively low resistance. The first-first electrode 216a and the second-first electrode 216b may be configured by a transparent conductive layer having a higher resistance than transparent conductive oxide TCO of indium tin oxide ITO of the conventional art. Therefore, it is assumed that the first-first electrode 216a and the second-first electrode 216b are configured by a transparent high resistance conductive layer for the convenience of description.

The first-first electrode 216a is formed on an auxiliary electrode 211 to cover the auxiliary electrode 211 and the second-first electrode 216b may be formed in an emission area divided by a net type auxiliary electrode 211.

In this case, the first-first electrode 216a of the present disclosure uses a transparent high resistance conductive layer having a sheet resistance of 108 to 109Ω/☐ instead of TCO such as ITO of the conventional art.

That is, as described above, in the present disclosure, a transparent high resistance conductive layer such as a conductive polymer or carbon based material or a nanowire based material is used as the first-first electrode 216a instead of ITO of the conventional art. Therefore, a lighting failure of the entire panel caused by a short due to foreign materials may be solved without reducing the aperture ratio.

As described above, a conductive polymer, a carbon based material, or a nanowire based material may be used for the transparent high resistance conductive layer.

The conductive polymer material may include a solvent, a binder, and other additives in addition to the conductive material. In this case, 1 to 10% PEDOT:PSS may be included as the conductive material.

The solvent may include 80 to 90% of water or alcohol and the binder may include 10 to 20% of a silicon or acrylic material such as tetraethyl orthosilicate (TEOS), SSQ, or polysiloxane.

Approximately 1% of a leveling agent or surfactant may be included as the additives.

Further, the carbon based material may include graphene, a single-walled carbon nanotube or a multiple-walled carbon nanotube as a conductive material.

The nanowire based material may include CuNW, AgNW, or AuNW as a conductive material.

As described above, the transparent high resistance conductive layer of the present disclosure configured by adding a conductive core such as a conductive polymer, a carbon based material, or a nanowire based material to a silicon oxide base using TEOS may adjust the resistance from several Ω/☐ to 109Ω/☐ or higher in accordance with a content wt % of the conductive core.

Further, in the first and second contact electrodes 227 and 228 and the second-first electrode 216b of the present disclosure, the resistance is lowered to be 103 to 104Ω/☐ by performing a post-treatment on the transparent high resistance conductive layer of the first-first electrode 216a, thereby suppressing the deterioration of the luminance of the panel. That is, when the second-first electrode 216b is formed of the transparent high resistance conductive material, similarly to the first-first electrode 216a, the luminance may be lowered due to current drop. However, the resistance is adjusted (to 103 to 104Ω/☐) through the post-treatment such as a thermal treatment by plasma or laser so that a normal luminance may be ensured.

In this case, the post-treatment is not performed on the first-first electrode 216a except for the second-first electrode 216b of the emission area so that the original resistance value (108 to 109Ω/☐) may be maintained. However, the present disclosure is not limited thereto and instead of the post-treatment, the content of the conductive core is adjusted as described above, so that the first-first electrode 216a and the second-first electrode 216b may be formed by transparent high resistance conductive layers having different resistance values, respectively.

The first electrode 216 configured as described above extends to the first contact unit CA1 outside the illuminating unit EA to configure the first contact electrode 227. The second contact electrode 228 which is electrically insulated from the first electrode 216 may be disposed in the second contact unit CA2. That is, the second contact electrode 228 is disposed on the same layer as the first electrode 216 but is separated from the first electrode 216 to be electrically insulated therefrom.

In this case, when the first electrode 216 including the first contact electrode 227 and the second contact electrode 228 of the present disclosure are formed of an organic layer, a coating method may be applied. Therefore, the substrate 210 on which the auxiliary electrode 211 is formed may be planarized.

The auxiliary electrode 211 is disposed in the illumination unit EA and the first contact unit CA1 of the substrate 210 to be electrically connected to the first electrode 216 and the first contact electrode 227.

The auxiliary electrode 211 is disposed over the entire illuminating unit EA to have a net type with a small thickness, a mesh type, a hexagonal or octagonal, or a circular shape to allow a uniform current to be applied to the second-first electrode 216b on the entire illuminating unit EA. Therefore, the light with a uniform luminance may be emitted in the large size lighting apparatus 200.

In this case, as described above, the auxiliary electrode 211 according to the present disclosure is formed by nanowire such as AgNW, CuNW, and AuNW, instead of an opaque metal of the conventional art. That is, the auxiliary electrode 211 is formed by AgNW having a transmittance of approximately 90%, instead of an opaque metal having a transmittance of almost 0%, to improve the aperture ratio.

In this case, according to the second exemplary aspect of the present disclosure, a first protective layer above the auxiliary electrode 211 is removed so that the upper portion of the auxiliary electrode is also used as an emission area. Therefore, the aperture ratio may be drastically improved. That is, a first-first electrode 216a which is a high resistance conductive layer is applied instead of the first protective layer and a transparent nanowire is applied as an auxiliary electrode 211 instead of the opaque conductive material, so that light interruption is minimized. In this case, the light interruption due to the auxiliary electrode which is a non-emission area of the conventional art is improved so that the luminance and the lifespan are increased in accordance with improvement of the aperture ratio.

The organic light emitting layer 230 and the second electrode 226 may be disposed above the first substrate 210 on which the first electrode 216 is disposed. In the second exemplary aspect of the present disclosure, since the first protective layer is not provided, the second electrode 226 may be directly electrically connected to the second contact electrode 228 disposed therebelow.

As described above, the organic light emitting layer 230 is a white light emitting layer and may be configured by a red light emitting layer, a blue light emitting layer, and a green light emitting layer or may be configured by a tandem structure including a blue light emitting layer and a yellow-green light emitting layer. Further, the organic light emitting layer 230 may further include an electron injection layer and a hole injection layer which inject electrons and holes to the light emitting layer, respectively and an electron transport layer and a hole transport layer which transport the injected electrons and holes to the light emitting layer, respectively, and a charge generating layer which generates charges such as electrons and holes.

As for the second electrode 226, a material having a low work function is desirable so as to easily inject electrons into the organic light emitting layer 230. A specific example of the material used for the second electrode 226 includes metals such as magnesium, calcium, sodium, titanium, indium, yttrium, lithium, gadolinium, aluminum, silver, tin, and lead, or an alloy thereof.

The first electrode 216, the organic light emitting layer 230, and the second electrode 226 of the illuminating unit EA configure the organic light emitting diode.

In the second exemplary aspect of the present disclosure, the first protective layer is not provided so that the organic light emitting diode may also be formed above the auxiliary electrode 211. Therefore, an upper portion of the auxiliary electrode 211 is also utilized as an emission area so that the aperture ratio may be drastically improved.

In this case, even though it is not illustrated, the second protective layer and the third protective layer may be provided on the substrate 210 on which the second electrode 226 is formed.

The second protective layer according to the second exemplary aspect of the present disclosure is formed to cover the organic light emitting layer 230 and the second electrode 226 of the illuminating unit EA as described above to suppress the moisture from permeating into the organic light emitting layer 230 of the illuminating unit EA.

That is, in the present disclosure, in addition to an encapsulating unit of an adhesive agent 218 and a metal film 270, the second protective layer and the third protective layer are formed to cover the organic light emitting layer 230 and the second electrode 226 of the illuminating unit EA. Therefore, the moisture cannot permeate into the organic light emitting layer 230 of the illuminating unit EA of the lighting apparatus 200 from which actual light is emitted to be output.

The second protective layer may be configured by an organic material such as photoacryl. Further, the third protective layer may be configured by an inorganic material such as SiOx or SiNx, but the present disclosure is not limited thereto.

A predetermined encapsulation agent may be provided above the third protective layer. The encapsulation agent may use an epoxy compound, an acrylate compound, or an acrylic compound.

As described above, the first contact electrode 227 extending from the first electrode 216 is exposed to the outside on the substrate 210 of the first contact unit CA1. Further, the second contact electrode 228 which is electrically connected to the second electrode 226 is exposed to the outside on the substrate 210 of the second contact unit CA2. Therefore, the first contact electrode 227 and the second contact electrode 228 are electrically connected to an external power supply to apply the current to the first electrode 216 and the second electrode 226.

An adhesive agent 218 such as a pressure sensitive adhesive (PSA) may be applied on the third protective layer and the metal film 270 is disposed thereon so that the metal film 270 is attached to the third protective layer to seal the lighting apparatus 200.

In this case, the encapsulating unit of the adhesive agent 218 and the metal film 270 may be attached to sufficiently cover the second protective layer and the third protective layer.

Further, a predetermined protective film 275 may be attached to the entire surface of the illuminating unit EA of the substrate 210 excluding the contact units CA1 and CA2.

The adhesive agent 218 may use a photo-curing adhesive or a thermosetting adhesive.

Hereinafter, a manufacturing method of a lighting apparatus using an organic light emitting diode according to a second exemplary aspect of the present disclosure will be described in detail with reference to the drawings.

FIGS. 13A to 13F are plan views sequentially illustrating a manufacturing method of a lighting apparatus using an organic light emitting diode according to a second exemplary aspect of the present disclosure illustrated in FIG. 11.

FIGS. 14A to 14F are cross-sectional views sequentially illustrating a manufacturing method of a lighting apparatus using an organic light emitting diode according to a second exemplary aspect of the present disclosure illustrated in FIG. 12.

Figure 13A:
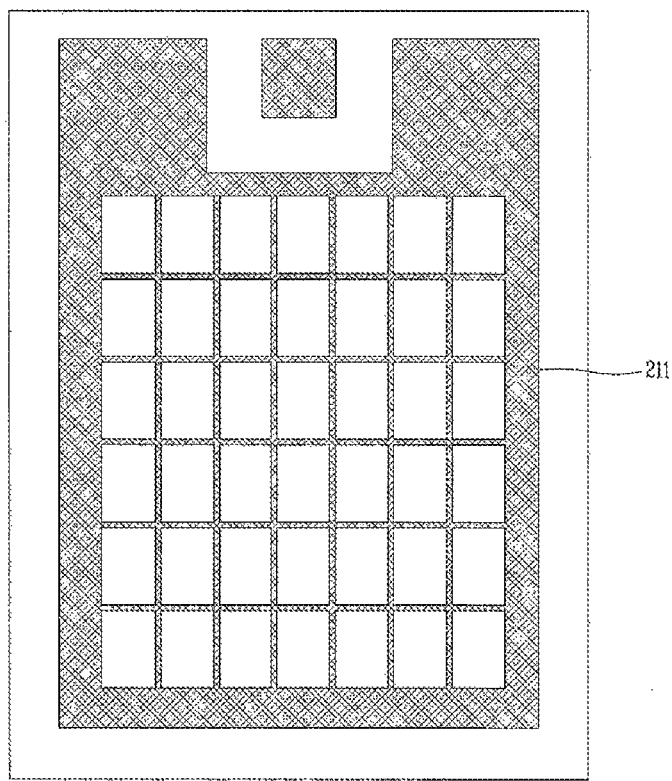
FIGS. 13A to 13F are plan views sequentially illustrating a manufacturing method of a lighting apparatus using an organic light emitting diode according to a second exemplary aspect of the present disclosure illustrated in FIG. 11.
Figure 14A:
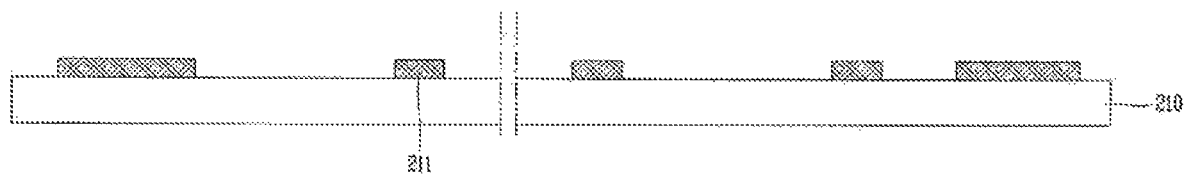
FIGS. 14A to 14F are cross-sectional views sequentially illustrating a manufacturing method of a lighting apparatus using an organic light emitting diode according to a second exemplary aspect of the present disclosure illustrated in FIG. 12.

First, referring to FIGS. 13A and 14A, an auxiliary electrode 211 which is formed of nanowire such as AgNW, CuNW and AuNW is formed in an illuminating unit and first and second contact units of the substrate 210.

Even though it is not illustrated in the drawings, before forming the auxiliary electrode 211 on the substrate 210, a predetermined buffer layer and an internal light extracting layer may be formed on the entire surface of the substrate 210.

Further, the auxiliary electrode 211 is disposed over the entire illuminating unit to have a net type with a small thickness (shown in FIG. 13A), a mesh type, a hexagonal or octagonal, or a circular shape.

Figure 13B:
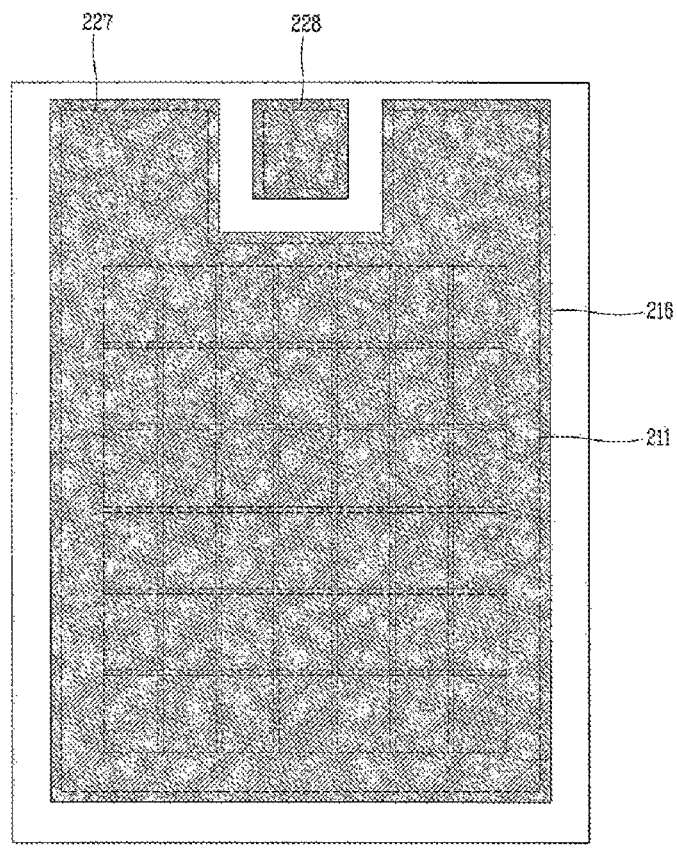
Figure 14B:
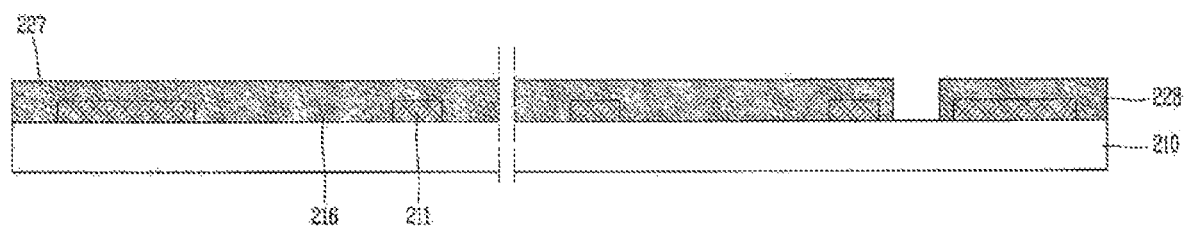

Therefore, referring to FIGS. 13B and 14B, a transparent high resistance conductive layer is laminated over the entire substrate 210.

In this case, as described above, a conductive polymer, a carbon based material, or a nanowire based material may be used for the transparent high resistance conductive layer.

The conductive polymer material may include a solvent, a binder, and other additives in addition to the conductive material. In this case, 1 to 10% PEDOT:PSS may be included as the conductive material.

The solvent may include 80 to 90% of water or alcohol and the binder may include 10 to 20% of a silicon or acrylic material such as tetraethyl orthosilicate (TEOS), SSQ, or polysiloxane.

Approximately 1% of a leveling agent or surfactant may be included as the additives.

Further, the carbon based material may include graphene, a single-walled carbon nanotube or a multiple-walled carbon nanotube as a conductive material.

The nanowire based material may include CuNW, AgNW, or AuNW as a conductive material.

In this case, the transparent high resistance conductive layer of the present disclosure may adjust the resistance from several $\Omega/\square$ to $10^9 \Omega/\square$ or higher in accordance with a content wt % of the conductive polymer, the carbon based material, or the nanowire based material. For example, the sheet resistance may be adjusted to be $10^8$ to $10^9$ $\Omega/\square$.

As described above, in the present disclosure, a transparent high resistance conductive layer having a sheet resistance of $10^8$ to $10^9 \Omega/\square$ is used, instead of ITO of the conventional art, without adding the short reduction pattern, to control the concentrated current due to the short by increasing the resistance of the first electrode. In this case, the short reduction pattern is removed so that the aperture ratio may be improved.

Further, as described above, the transparent high resistance conductive layer of the present disclosure may be formed by applying a coating method and thus the substrate 210 on which the auxiliary electrode 211 is formed may be planarized. In this case, a failure such as seam or short which may be generated at a tapered portion of the auxiliary electrode 211 may be minimized.

Thereafter, the transparent high resistance conductive layer is selectively etched to form the first electrode 216 including the first contact electrode 227 and the second contact electrode 228 is formed in the illuminating unit and the first and second contact units.

In this case, the first electrode 216 extends to the first contact unit outside the illuminating unit to configure the first contact electrode 227 and the second contact electrode 228 which is electrically insulated from the first electrode 216 may be formed in a part of the illuminating unit and the second contact unit. That is, the second contact electrode 228 is formed on the same layer as the first electrode 216 but is separated from the first electrode 216 to be electrically insulated.

For example, in FIG. 13B, it is illustrated that the first electrode 216 including the first contact electrode 227 is entirely formed to be a quadrangular shape, but an upper center portion is removed to configure a recession and the second contact electrode 228 is formed in the recession as an example. However, the present disclosure is not limited thereto.

Figure 13C:
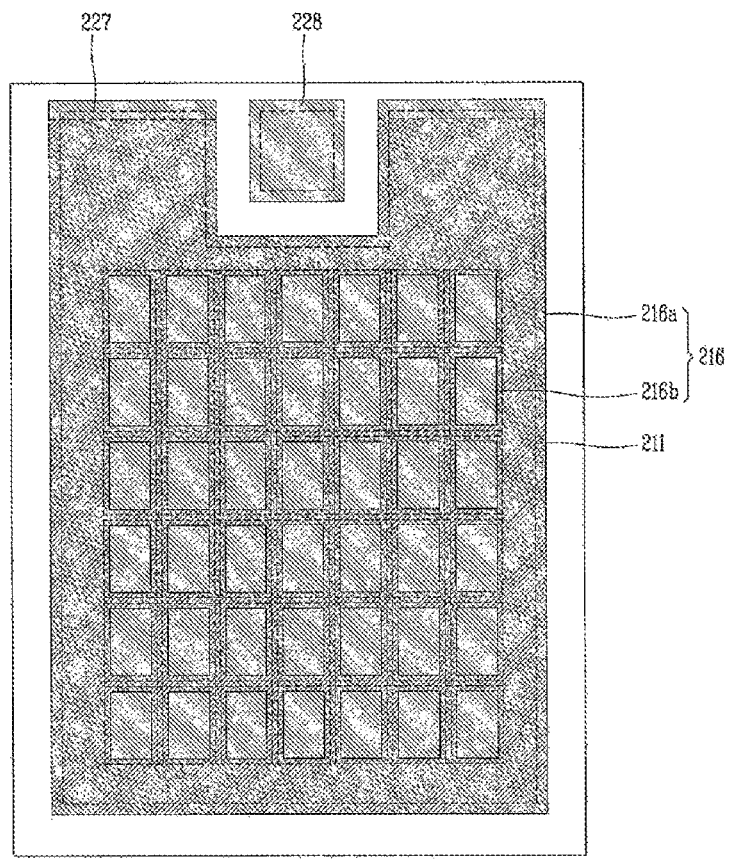
Figure 14C:
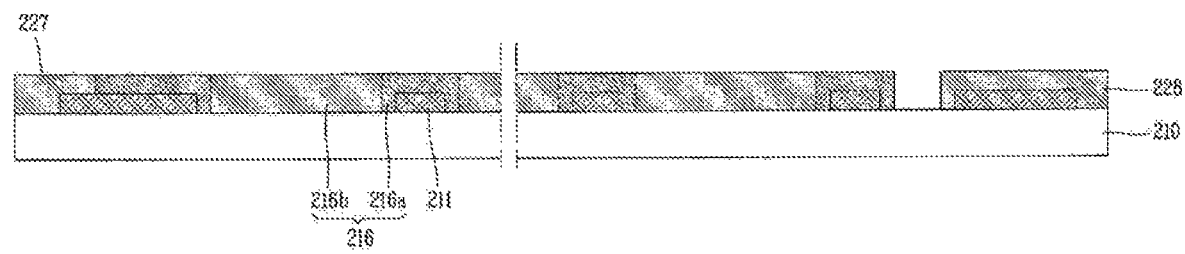

Thereafter, referring to FIGS. 13C and 14C, a post-treatment is performed on the first and second contact electrodes 227 and 228 and the first electrode 216 of the emission area to lower the sheet resistance of the transparent conductive layer to be $10^3$ to $10^4 \Omega/\square$. As a result, the first electrode 216 may be divided into a first-first electrode 216a having a relatively high resistance and a second-first electrode 216b having a relatively low resistance. The first-first electrode 216a is formed on an auxiliary electrode 211 to cover the auxiliary electrode 211 and the second-first electrode 216b may be formed in an emission area divided by a net type auxiliary electrode 211.

As described above, according to the present disclosure, the first and second contact electrodes 227 and 228 and the first electrode 216 of the emission area are subject to the post-treatment to lower the resistance to $10^3$ to $10^4 \Omega/\square$, thereby suppressing the lowering of the luminance of the panel. That is, in the emission area, there is a possibility of the lowering of the luminance due to the current drop by the high resistance conductive layer, but the resistance is adjusted ($10^3$ to $10^4 \Omega/\square$) through the post-treatment such as a thermal treatment by plasma or laser, so that the normal luminance may be ensured.

In this case, as described above, the first electrode 216 in the non-emission area excluding the emission area, that is, the first-first electrode 216a is not subject to the post-treatment so that the original resistance value ($10^8$ to $10^9 \Omega/\square$) may be maintained.

Further, in the second exemplary aspect of the present disclosure, a first-first electrode 216a which is a high resistance conductive layer is applied instead of the first protective layer and a transparent nanowire is applied as an auxiliary electrode 211 instead of the opaque conductive material, so that light interruption is minimized.

Referring to FIGS. 13D and 13E and 14D and 14E, an organic light emitting layer 230 and a second electrode 226 which are formed of an organic light emitting material and metal, respectively, are formed in the illuminating unit of the substrate 210.

Figure 13D:
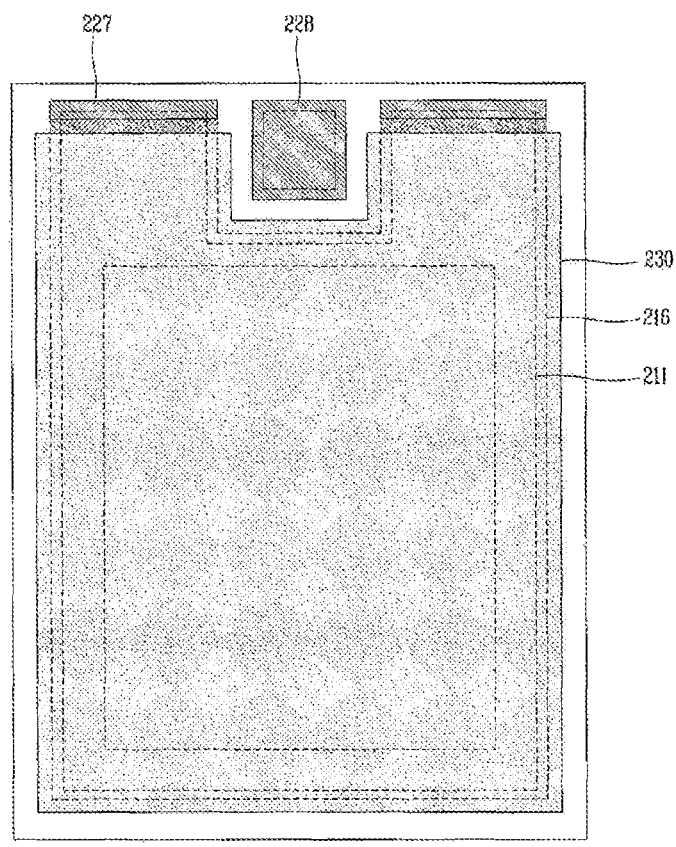
Figure 14D:
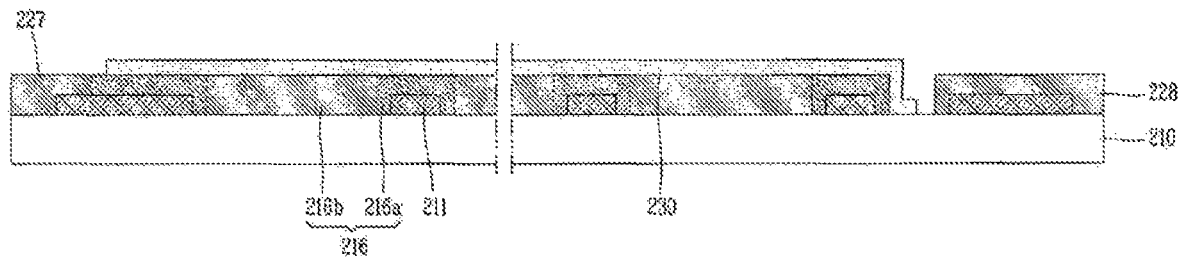

First, referring to FIGS. 13D and 14D, the organic light emitting layer 230 formed of the organic light emitting material is formed in the illuminating unit of the substrate 210.

As described above, the organic light emitting layer 230 is a white light emitting layer and may be configured by a red light emitting layer, a blue light emitting layer, and a green light emitting layer or may be configured by a tandem structure including a blue light emitting layer and a yellow-green light emitting layer. Further, the organic light emitting layer 230 may further include an electron injection layer and a hole injection layer which inject electrons and holes to the light emitting layer, respectively and an electron transport layer and a hole transport layer which transport the injected electrons and holes to the light emitting layer, respectively, and a charge generating layer which generates charges such as electrons and holes.

Further, the organic light emitting layer 230 according to the second exemplary aspect of the present disclosure is formed not only in an upper portion and a side of the first-first electrode 216a, but also on the surface of the substrate 210 to enclosure the side of the first-first electrode 216a which is exposed to the outside between the first contact electrode 227 and the second electrode 228. However, the present disclosure is not limited thereto, but the organic light emitting layer 230 according to the second exemplary aspect of the present disclosure extends to the second contact unit to be formed on the upper portion of the second contact electrode 228. In this case, a contact hole which exposes a part of the second contact electrode 228 may be formed.

Figure 13E:
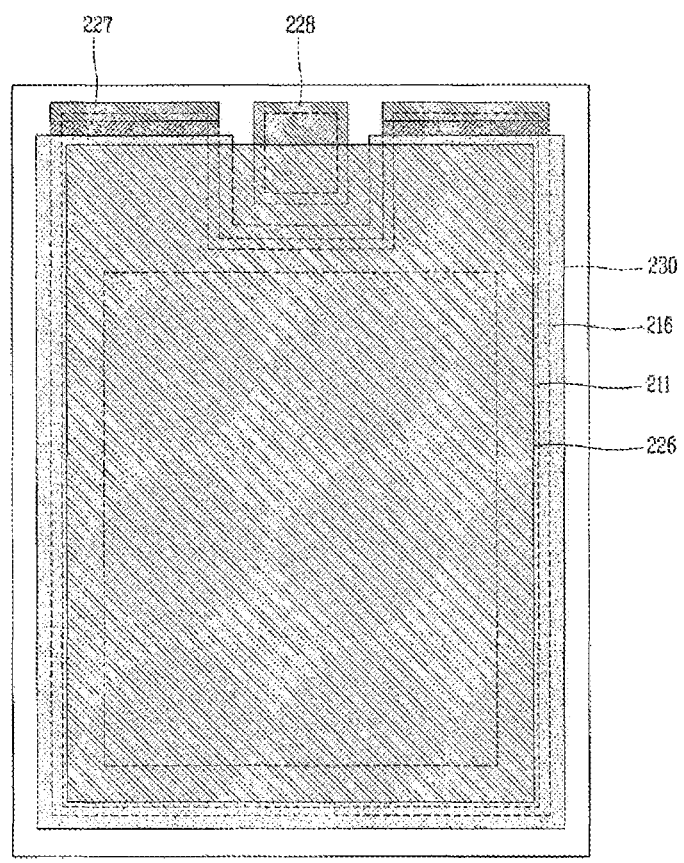
Figure 14E:
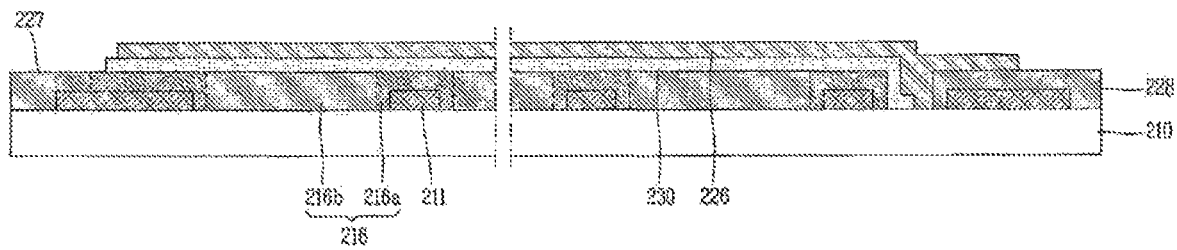

Next, referring to FIGS. 13E and 14E, the second electrode 226 which is formed of metal is formed on the organic light emitting layer 230 in the illuminating unit of the substrate 210.

In this case, the second electrode 226 may be in direct contact with the second contact electrode 228 therebelow or may be in electrical contact with the second contact electrode 228 through a contact hole provided in the organic light emitting layer 230.

The second electrode 226 may be formed by metals such as magnesium, calcium, sodium, titanium, indium, yttrium, lithium, gadolinium, aluminum, silver, tin, and lead, or an alloy thereof.

The first electrode 216, the organic light emitting layer 230, and the second electrode 226 of the illuminating unit configure the organic light emitting diode.

In this case, in the second exemplary aspect of the present disclosure, a first protective layer above the auxiliary electrode 211 is removed so that the upper portion of the auxiliary electrode is also used as an emission area. Therefore, the aperture ratio may be drastically improved.

Next, even though it is not illustrated, the second protective layer which is formed of an organic material may be formed in the illuminating unit of the substrate 210 to cover the organic light emitting layer 230 and the second electrode 226.

In this case, the second protective layer is formed to cover the organic light emitting layer 230 and the second electrode 226 of the illuminating unit as described above to suppress the moisture from permeating into the organic light emitting layer 230 of the illuminating unit.

Next, a third protective layer may be formed in the illuminating unit of the substrate 210 to cover the second protective layer.

The third protective layer may be configured by an inorganic material such as SiOx or SiNx, but the present disclosure is not limited thereto.

A predetermined encapsulation agent may be further provided above the third protective layer. The encapsulation agent may use an epoxy compound, an acrylate compound, or an acrylic compound.

Figure 13F:
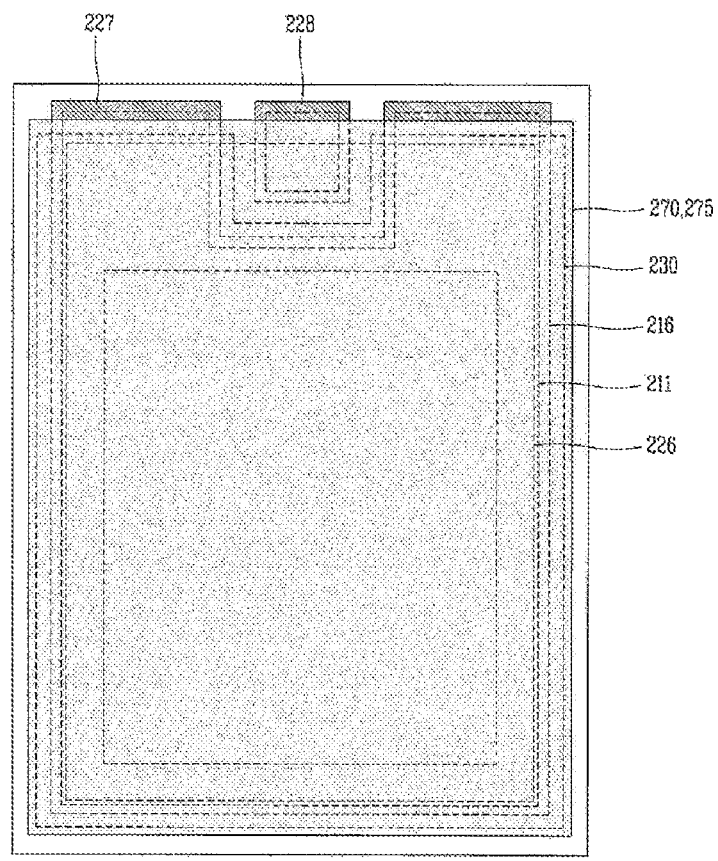
Figure 14F:
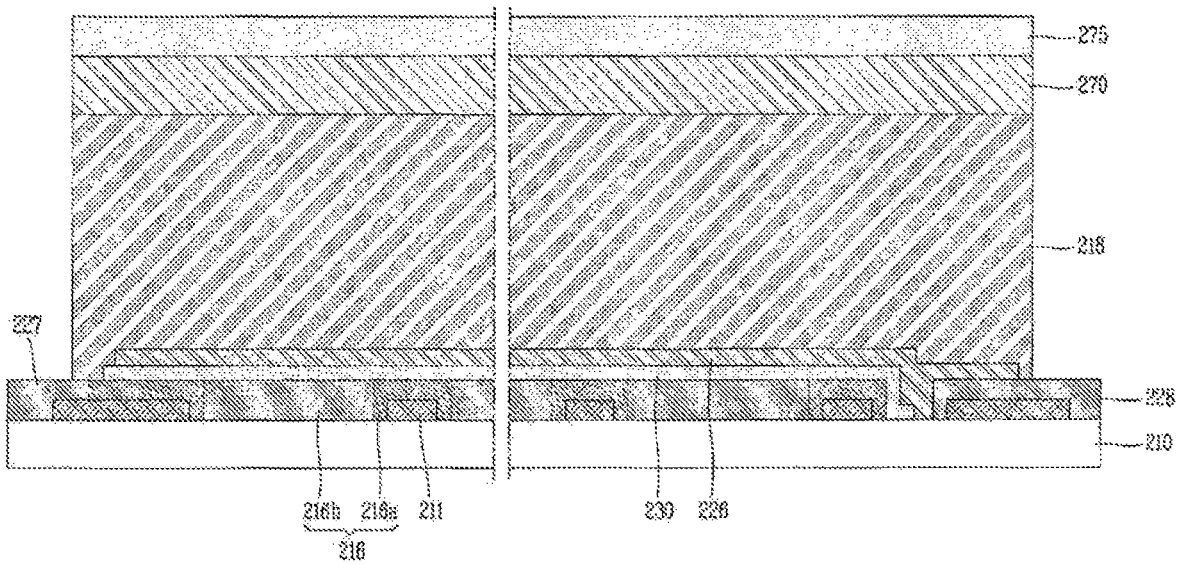

Next, referring to FIGS. 13F and 14F, an adhesive agent 218 configured by a photo-curing adhesive material or a thermosetting adhesive material is applied on the illuminating unit of the substrate 210. After positioning the metal film 270 thereon, the adhesive agent 218 is cured to attach the metal film 270.

In this case, the first and second contact units are not blocked by the encapsulation unit of the metal film 270 so as to be electrically connected to the outside through the first and second contact electrodes 227 and 228.

Thereafter, a predetermined protective film 275 is attached on the entire surface of the illuminating unit of the substrate 210 excluding the contact unit to complete the lighting apparatus.

The exemplary aspects of the present disclosure can also be described as follows:

According to an aspect of the present disclosure, a lighting apparatus using an organic light emitting diode includes an auxiliary electrode configured of a transparent nanowire on a substrate, a first-first electrode made of a transparent conductive layer and provided to cover the auxiliary electrode and a second-first electrode which is provided in an emission area divided by the auxiliary electrode, an organic light emitting layer and a second electrode in an illuminating unit of the substrate including the first and second first electrodes, and an encapsulating unit in the illuminating unit of the substrate.

According to another aspect of the present disclosure, the first-first electrode may have a higher resistance value than ITO and the second-first electrode may have a lower resistance value than the first-first electrode.

According to still another aspect of the present disclosure, the first-first electrode may have a sheet resistance of 108Ω/□ to 109Ω/□ and the second-first electrode has a sheet resistance of 103Ω/□ to 104 Ω/□.

According to still another aspect of the present disclosure, the transparent conductive layer may include 1% to 10% of a conductive material, 80% to 90% of a solvent, 10% to 20% of a binder, and approximately 1% of additives.

According to still another aspect of the present disclosure, the conductive material may include a conductive polymer, a carbon based material, or a nanowire based material.

According to still another aspect of the present disclosure, the lighting apparatus may further include: a first protective layer on the first-first electrode such that a side thereof matches the first-first electrode.

According to still another aspect of the present disclosure, the first-first electrode on the auxiliary electrode, the organic light emitting layer, and the second electrode other than the emission area may constitute the organic light emitting diode to emit light.

According to still another aspect of the present disclosure, the lighting apparatus may further include: first and second contact electrodes which are provided in first and second contact units of the substrate and are not blocked by the encapsulating unit to be exposed to the outside and the first contact electrode may be connected to the first-first electrode and second-first electrode and the second contact electrode may be electrically insulated from the first contact electrode.

According to still another aspect of the present disclosure, the organic light emitting layer may extend from a part of an upper portion and a side of the first-first electrode to a surface of the substrate to enclose the side of the first-first electrode which is exposed to the outside between the first contact electrode and the second contact electrode.

According to another aspect of the present disclosure, a manufacturing method of a lighting apparatus using an organic light emitting diode includes: forming an auxiliary electrode on a substrate using a transparent nanowire, forming a first electrode using a transparent conductive layer having a higher resistance value than ITO, on the substrate on which the auxiliary electrode is formed, lowering the resistance value of the first electrode of an emission area divided by the auxiliary electrode through a thermal treatment, forming an organic light emitting layer and a second electrode in an illuminating unit of the substrate on which the first electrode is formed, and forming an encapsulating unit in the illuminating unit of the substrate.

According to another aspect of the present disclosure, the first electrode may be configured by a second-first electrode in which a resistance value is lowered by the thermal treatment and a first-first electrode above the auxiliary electrode in which the resistance is not changed.

According to still another aspect of the present disclosure, the resistance value may be lowered to $10^3 \Omega/\square$ to $10^4 \Omega/\square$ by performing a thermal treatment of irradiating plasma or laser on the first electrode of the emission area having a sheet resistance of $10^8 \Omega/\square$ to $10^9$ $\Omega/\square$.

According to still another aspect of the present disclosure, the manufacturing method may further include: forming a first protective layer on the first-first electrode such that a side thereof matches the first-first electrode.

According to still another aspect of the present disclosure, the first-first electrode on the auxiliary electrode, the organic light emitting layer, and the second electrode other than the emission area may configure the organic light emitting diode to emit light.

According to still another aspect of the present disclosure, the method may further include: forming first and second contact electrodes which are not blocked by the encapsulating unit to be exposed to the outside, in first and second contact units of the substrate and the first contact electrode may be connected to the first-first electrode and second-first electrode and the second contact electrode may be electrically insulated from the first contact electrode.

According to still another aspect of the present disclosure, the organic light emitting layer may extend from a part of an upper portion and a side of the first-first electrode to a surface of the substrate to enclose the side of the first-first electrode which is exposed to the outside between the first contact electrode and the second contact electrode.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A lighting apparatus using an organic light emitting diode, the lighting apparatus comprising:
   a substrate including an illuminating area and a contact area;
   an auxiliary electrode disposed on the illuminating area and including a nanowire and openings;
   a first electrode covering the auxiliary electrode and including a first portion disposed on the nanowire and a second portion disposed in the openings, and the second portion has a lower resistance than the first portion;
   an organic light emitting layer on the first electrode;
   a second electrode on the organic light emitting layer; and
   an encapsulation layer covering the illuminating area.

2. The lighting apparatus according to claim 1, wherein the first portion has a sheet resistance in a range of $10^8 \Omega/\square$ to $10^9$ $\Omega/\square$.

3. The lighting apparatus according to claim 1, wherein the second portion has a sheet resistance in a range of $10^3 \Omega/\square$ to $10^4$ $\Omega/\square$.

4. The lighting apparatus according to claim 1, wherein the first electrode includes 1% to 10% of a conductive material, 80% to 90% of a solvent, 10% to 20% of a binder, and approximately 1% of additives.

5. The lighting apparatus according to claim 4, wherein the conductive material includes a conductive polymer, a carbon based material, or a nanowire based material.

6. The lighting apparatus according to claim 4, further comprising a first protective layer on the first portion and having a side surface matching the first portion.

7. The lighting apparatus according to claim 6, wherein the first protective layer is formed corresponding to a position at which the auxiliary electrode is disposed in the illuminating area.

8. The lighting apparatus according to claim 6, wherein the first protective layer does not overlap the second portion.

9. The lighting apparatus according to claim 1, wherein the second portion is surrounded by the auxiliary electrode and the first portion in the illuminating area.

10. The lighting apparatus according to claim 1, the first electrode is extended to the contact area and the first electrode does not overlap with the encapsulation layer in the contact area.

11. The lighting apparatus according to claim 10, the auxiliary electrode is extended to the contact area.

* * * * *